(12) United States Patent
Linton et al.

(10) Patent No.: US 9,391,244 B2
(45) Date of Patent: *Jul. 12, 2016

(54) LIGHTING DEVICES, AN OPTICAL COMPONENT FOR A LIGHTING DEVICE, AND METHODS

(71) Applicant: QD VISION, INC., Lexington, MA (US)

(72) Inventors: John R. Linton, Concord, MA (US); Emily M. Squires, Littleton, MA (US); Rohit Modi, Freemont, CA (US)

(73) Assignee: QD VISION, INC., Lexington, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/644,810

(22) Filed: Mar. 11, 2015

(65) Prior Publication Data

US 2015/0287890 A1    Oct. 8, 2015

Related U.S. Application Data

(63) Continuation of application No. 13/372,262, filed on Feb. 13, 2012, now Pat. No. 8,981,339, which is a continuation of application No. PCT/US2010/045624, filed on Aug. 16, 2010.

(60) Provisional application No. 61/234,179, filed on Aug. 14, 2009.

(51) Int. Cl.
*H01L 21/00* (2006.01)
*H01L 33/50* (2010.01)
(Continued)

(52) U.S. Cl.
CPC .............. *H01L 33/50* (2013.01); *C09K 11/025* (2013.01); *C09K 11/883* (2013.01); *H01L 33/58* (2013.01); *H05B 33/14* (2013.01); *H01L 33/504* (2013.01); *Y02B 20/181* (2013.01)

(58) Field of Classification Search
CPC ......................... H01L 33/06; H01L 21/02601
USPC .................................. 257/13, 94, 98; 438/47
See application file for complete search history.

(56) References Cited

U.S. PATENT DOCUMENTS

| 4,130,343 A | 12/1978 | Miller et al. |
| 5,354,707 A | 10/1994 | Chapple-Sokol et al. |

(Continued)

FOREIGN PATENT DOCUMENTS

| CN | 101228640 A | 1/2006 |
| CN | 101487581 A | 7/2009 |

(Continued)

OTHER PUBLICATIONS

Ashdown, I., et al., "Six-color mixing and warm-white/green/blue offer new approaches to generating white LED light" LEDs Magzine, Oct. 2006, pp. 19-21.

(Continued)

*Primary Examiner* — Nicholas Tobergte

(57) ABSTRACT

A white-light emitting lighting device comprising one or more light emitting light sources (preferably solid state semiconductor light emitting diodes) that emit off-white light during operation, wherein the off-white light includes a spectral output including at least one spectral component in a first spectral region from about 360 nm to about 475 nm, at least one spectral component in a second spectral region from about 475 nm to about 575 nm, and at least one deficiency in at least one other spectral region, and an optical component that is positioned to receive at least a portion of the off-white light generated by the one or more light sources, the optical component comprising an optical material for converting at least a portion of the off-white light to one or more predetermined wavelengths, at least one of which has a wavelength in at least one deficient spectral region, such that light emitted by the lighting device comprises white light, wherein the optical material comprises quantum confined semiconductor nanoparticles. Also disclosed is an optical component, lighting fixture, a cover plate for a lighting fixture, and methods.

18 Claims, 4 Drawing Sheets

(51) Int. Cl.
*C09K 11/02* (2006.01)
*C09K 11/88* (2006.01)
*H05B 33/14* (2006.01)
*H01L 33/58* (2010.01)

(56) References Cited

U.S. PATENT DOCUMENTS

| | | | |
|---|---|---|---|
| 5,434,878 A | 7/1995 | Lawandy | |
| 5,442,254 A | 8/1995 | Jaskie | |
| 5,455,489 A | 10/1995 | Bhargava | |
| 5,504,661 A | 4/1996 | Szpak | |
| 5,599,897 A | 2/1997 | Nishiguchi et al. | |
| 5,975,711 A | 11/1999 | Parker et al. | |
| 6,069,440 A | 5/2000 | Shimizu et al. | |
| 6,322,901 B1 | 11/2001 | Bawendi et al. | |
| 6,340,824 B1 | 1/2002 | Komoto et al. | |
| 6,357,889 B1 | 3/2002 | Duggal et al. | |
| 6,464,898 B1 | 10/2002 | Tomoike et al. | |
| 6,501,091 B1 | 12/2002 | Bawendi et al. | |
| 6,576,155 B1 | 6/2003 | Barbera-Guillem | |
| 6,576,291 B2 | 6/2003 | Bawendi et al. | |
| 6,576,930 B2 | 6/2003 | Reeh et al. | |
| 6,600,175 B1 | 7/2003 | Baretz et al. | |
| 6,608,332 B2 | 8/2003 | Shimizu et al. | |
| 6,608,439 B1 | 8/2003 | Sokolik et al. | |
| 6,613,247 B1 | 9/2003 | Hohn et al. | |
| 6,639,733 B2 | 10/2003 | Minano et al. | |
| 6,641,755 B2 | 11/2003 | Tomoike et al. | |
| 6,703,781 B2 | 3/2004 | Zovko | |
| 6,710,366 B1 | 3/2004 | Lee et al. | |
| 6,714,711 B1 | 3/2004 | Lieberman et al. | |
| 6,734,465 B1 | 5/2004 | Taskar et al. | |
| 6,784,603 B2 | 8/2004 | Pelka | |
| 6,791,259 B1 | 9/2004 | Stokes et al. | |
| 6,801,270 B2 | 10/2004 | Faris et al. | |
| 6,812,500 B2 | 11/2004 | Reeh et al. | |
| 6,864,626 B1 | 3/2005 | Weiss et al. | |
| 6,876,796 B2 | 4/2005 | Garito et al. | |
| 6,957,608 B1 | 10/2005 | Hubert et al. | |
| 6,961,105 B2 | 11/2005 | Chang et al. | |
| 7,008,559 B2 | 3/2006 | Chen | |
| 7,042,020 B2 | 5/2006 | Negley | |
| 7,045,956 B2 | 5/2006 | Braune et al. | |
| 7,065,285 B2 | 6/2006 | Chen et al. | |
| 7,066,623 B2 | 6/2006 | Lee et al. | |
| 7,071,616 B2 | 7/2006 | Shimizu et al. | |
| 7,075,225 B2 | 7/2006 | Baroky et al. | |
| 7,078,732 B1 | 7/2006 | Reeh et al. | |
| 7,091,653 B2 | 8/2006 | Ouderkirk et al. | |
| 7,108,416 B1 | 9/2006 | Osawa | |
| 7,110,299 B2 | 9/2006 | Forbes | |
| 7,144,131 B2 | 12/2006 | Rains | |
| 7,168,833 B2 | 1/2007 | Schottland et al. | |
| 7,213,940 B1 | 5/2007 | Van De Ven et al. | |
| 7,226,856 B1 | 6/2007 | Lopatin et al. | |
| 7,242,030 B2 | 7/2007 | Wang et al. | |
| 7,245,065 B2 | 7/2007 | Ghosh et al. | |
| 7,279,716 B2 | 10/2007 | Chen | |
| 7,294,861 B2 | 11/2007 | Schardt et al. | |
| 7,329,371 B2 | 2/2008 | Setlur et al. | |
| 7,393,618 B2 | 7/2008 | Ioku et al. | |
| 7,473,922 B2 | 1/2009 | Uchiyama et al. | |
| 7,522,647 B2 | 4/2009 | Hatori et al. | |
| 7,560,859 B2 | 7/2009 | Saito et al. | |
| 7,592,618 B2 | 9/2009 | Khang et al. | |
| 7,595,508 B2 | 9/2009 | Otsubo et al. | |
| 7,679,102 B2 | 3/2010 | Chik et al. | |
| 7,686,493 B2 | 3/2010 | Roshan et al. | |
| 7,695,150 B2 | 4/2010 | Dejima et al. | |
| 7,703,942 B2 | 4/2010 | Narendran et al. | |
| 7,722,422 B2 | 5/2010 | Cok | |
| 7,723,744 B2 | 5/2010 | Gillies et al. | |
| 7,732,237 B2 | 6/2010 | Xie | |
| 7,732,823 B2 | 6/2010 | Kawaguchi | |
| 7,750,359 B2 | 7/2010 | Narendran et al. | |
| 7,750,425 B2 | 7/2010 | Forrest et al. | |
| 7,791,271 B2 | 9/2010 | Cok | |
| 7,795,609 B2 | 9/2010 | Huffaker et al. | |
| 7,813,160 B2 | 10/2010 | Drndic et al. | |
| 7,837,348 B2 | 11/2010 | Narendran et al. | |
| 7,880,377 B2 | 2/2011 | Orita et al. | |
| 7,902,748 B2 | 3/2011 | Cok | |
| 7,952,105 B2 | 5/2011 | Cok | |
| 7,969,085 B2 | 6/2011 | Cok | |
| 7,982,396 B2 | 7/2011 | Cok | |
| 8,033,706 B1 | 10/2011 | Kelly et al. | |
| 8,044,414 B2 | 10/2011 | Hori et al. | |
| 8,174,181 B2 | 5/2012 | Bawendi et al. | |
| 8,353,613 B2 | 1/2013 | Choi et al. | |
| 8,405,063 B2 | 3/2013 | Kazlas et al. | |
| 8,642,977 B2 | 2/2014 | Comerford et al. | |
| 8,718,437 B2 | 5/2014 | Coe-Sullivan et al. | |
| 8,981,339 B2 * | 3/2015 | Linton et al. | 257/13 |
| 9,140,844 B2 | 9/2015 | Coe-Sullivan et al. | |
| 9,167,659 B2 | 10/2015 | Coe-Sullivan et al. | |
| 9,207,385 B2 | 12/2015 | Coe-Sullivan et al. | |
| 2001/0028055 A1 | 10/2001 | Fafard et al. | |
| 2002/0021003 A1 | 2/2002 | McGrew | |
| 2002/0053359 A1 | 5/2002 | Harman et al. | |
| 2002/0127224 A1 | 9/2002 | Chen | |
| 2002/0136932 A1 | 9/2002 | Yoshida | |
| 2002/0186921 A1 | 12/2002 | Schumacher et al. | |
| 2003/0010987 A1 | 1/2003 | Banin et al. | |
| 2003/0227249 A1 | 12/2003 | Mueller et al. | |
| 2004/0007169 A1 | 1/2004 | Ohtsu et al. | |
| 2004/0023010 A1 | 2/2004 | Bulovic et al. | |
| 2004/0091710 A1 | 5/2004 | Bawendi et al. | |
| 2004/0110002 A1 | 6/2004 | Kim et al. | |
| 2004/0135495 A1 | 7/2004 | Wu et al. | |
| 2004/0145289 A1 | 7/2004 | Ouderkirk et al. | |
| 2004/0178338 A1 | 9/2004 | Empedocles et al. | |
| 2004/0245912 A1 | 12/2004 | Thurk et al. | |
| 2004/0262583 A1 | 12/2004 | Lee | |
| 2005/0012076 A1 | 1/2005 | Morioka | |
| 2005/0051777 A1 | 3/2005 | Hill | |
| 2005/0135079 A1 | 6/2005 | Yin Chua et al. | |
| 2005/0164227 A1 | 7/2005 | Ogura et al. | |
| 2005/0200269 A1 | 9/2005 | Ng et al. | |
| 2005/0236556 A1 | 10/2005 | Sargent et al. | |
| 2005/0258418 A1 | 11/2005 | Steckel et al. | |
| 2005/0265404 A1 | 12/2005 | Ashdown | |
| 2006/0001036 A1 | 1/2006 | Jacob et al. | |
| 2006/0002101 A1 | 1/2006 | Wheatley et al. | |
| 2006/0003114 A1 | 1/2006 | Enlow et al. | |
| 2006/0034065 A1 | 2/2006 | Thurk | |
| 2006/0040103 A1 | 2/2006 | Whiteford et al. | |
| 2006/0043361 A1 | 3/2006 | Lee et al. | |
| 2006/0063029 A1 | 3/2006 | Jang et al. | |
| 2006/0063289 A1 | 3/2006 | Negley et al. | |
| 2006/0066210 A1 | 3/2006 | Ng et al. | |
| 2006/0068154 A1 | 3/2006 | Parce et al. | |
| 2006/0069314 A1 | 3/2006 | Farr | |
| 2006/0071218 A1 | 4/2006 | Takeda et al. | |
| 2006/0081862 A1 | 4/2006 | Chua et al. | |
| 2006/0103589 A1 | 5/2006 | Chua et al. | |
| 2006/0105481 A1 | 5/2006 | Boardman et al. | |
| 2006/0109682 A1 | 5/2006 | Ko et al. | |
| 2006/0113895 A1 | 6/2006 | Baroky et al. | |
| 2006/0146565 A1 | 7/2006 | Lee | |
| 2006/0157686 A1 | 7/2006 | Jang et al. | |
| 2006/0157721 A1 | 7/2006 | Tran et al. | |
| 2006/0196375 A1 | 9/2006 | Coe-Sullivan et al. | |
| 2006/0227546 A1 | 10/2006 | Yeo et al. | |
| 2006/0244358 A1 | 11/2006 | Kim et al. | |
| 2006/0268571 A1 | 11/2006 | Harada et al. | |
| 2006/0291252 A1 | 12/2006 | Lim et al. | |
| 2007/0004065 A1 | 1/2007 | Schardt et al. | |
| 2007/0012928 A1 * | 1/2007 | Peng et al. | 257/79 |
| 2007/0013996 A1 | 1/2007 | Verma | |
| 2007/0014318 A1 | 1/2007 | Hajjar et al. | |
| 2007/0018102 A1 | 1/2007 | Braune et al. | |
| 2007/0018558 A1 | 1/2007 | Chua et al. | |
| 2007/0034833 A1 | 2/2007 | Parce et al. | |
| 2007/0053208 A1 | 3/2007 | Justel et al. | |

(56) References Cited

U.S. PATENT DOCUMENTS

| | | |
|---|---|---|
| 2007/0072979 A1 | 3/2007 | Moad et al. |
| 2007/0085092 A1 | 4/2007 | Chen |
| 2007/0090755 A1 | 4/2007 | Eida et al. |
| 2007/0103068 A1 | 5/2007 | Bawendi et al. |
| 2007/0108888 A1 | 5/2007 | Chen et al. |
| 2007/0121129 A1 | 5/2007 | Eida et al. |
| 2007/0138932 A1 | 6/2007 | Morioka et al. |
| 2007/0145350 A1 | 6/2007 | Kobori |
| 2007/0170418 A1 | 7/2007 | Bowers et al. |
| 2007/0177380 A1 | 8/2007 | Schultz et al. |
| 2007/0190675 A1 | 8/2007 | Yamazaki et al. |
| 2007/0201056 A1 | 8/2007 | Cok et al. |
| 2007/0235751 A1 | 10/2007 | Radkov et al. |
| 2007/0246734 A1 | 10/2007 | Lee et al. |
| 2007/0262294 A1 | 11/2007 | Peterson et al. |
| 2007/0262714 A1 | 11/2007 | Bylsma |
| 2008/0001167 A1 | 1/2008 | Coe-Sullivan et al. |
| 2008/0001528 A1 | 1/2008 | Eida |
| 2008/0007156 A1 | 1/2008 | Gibson et al. |
| 2008/0012031 A1 | 1/2008 | Jang |
| 2008/0029710 A1 | 2/2008 | Sekiya et al. |
| 2008/0037282 A1 | 2/2008 | Kurihara |
| 2008/0048936 A1 | 2/2008 | Powell et al. |
| 2008/0057342 A1 | 3/2008 | Sekiya |
| 2008/0062717 A1 | 3/2008 | Lee |
| 2008/0084706 A1 | 4/2008 | Roshan et al. |
| 2008/0094829 A1 | 4/2008 | Narendran et al. |
| 2008/0106887 A1 | 5/2008 | Salsbury et al. |
| 2008/0117500 A1 | 5/2008 | Narendran et al. |
| 2008/0135914 A1 | 6/2008 | Krishna et al. |
| 2008/0144333 A1 | 6/2008 | Gourlay |
| 2008/0149958 A1 | 6/2008 | Reeh et al. |
| 2008/0169753 A1 | 7/2008 | Skipor et al. |
| 2008/0173886 A1 | 7/2008 | Cheon et al. |
| 2008/0218068 A1 | 9/2008 | Cok |
| 2008/0237540 A1 | 10/2008 | Dubrow |
| 2008/0237611 A1 | 10/2008 | Cok et al. |
| 2008/0246017 A1 | 10/2008 | Gillies et al. |
| 2008/0252198 A1 | 10/2008 | Katano et al. |
| 2008/0254210 A1 | 10/2008 | Lai et al. |
| 2008/0276817 A1 | 11/2008 | Hinch et al. |
| 2008/0278063 A1 | 11/2008 | Cok |
| 2008/0308825 A1 | 12/2008 | Chakraborty et al. |
| 2009/0017268 A1 | 1/2009 | Skipor et al. |
| 2009/0021148 A1 | 1/2009 | Hachiya et al. |
| 2009/0034292 A1 | 2/2009 | Pokrovskiy et al. |
| 2009/0059554 A1 | 3/2009 | Skipor et al. |
| 2009/0091239 A1 | 4/2009 | Cho et al. |
| 2009/0114932 A1 | 5/2009 | Chou |
| 2009/0152567 A1 | 6/2009 | Comerford et al. |
| 2009/0162011 A1 | 6/2009 | Coe-Sullivan et al. |
| 2009/0168415 A1 | 7/2009 | Deurenberg et al. |
| 2009/0184333 A1 | 7/2009 | Wang et al. |
| 2009/0208753 A1 | 8/2009 | Coe-Sullivan et al. |
| 2009/0212695 A1 | 8/2009 | Kim et al. |
| 2009/0215208 A1 | 8/2009 | Coe-Sullivan et al. |
| 2009/0236621 A1 | 9/2009 | Chakraborty |
| 2009/0236622 A1 | 9/2009 | Nishihara |
| 2009/0242871 A1 | 10/2009 | Kobayashi et al. |
| 2009/0272996 A1 | 11/2009 | Chakraborty |
| 2010/0001256 A1 | 1/2010 | Coe-Sullivan et al. |
| 2010/0002414 A1 | 1/2010 | Meir |
| 2010/0014799 A1 | 1/2010 | Bulovic et al. |
| 2010/0044729 A1 | 2/2010 | Naum et al. |
| 2010/0051898 A1 | 3/2010 | Kim et al. |
| 2010/0052512 A1 | 3/2010 | Clough et al. |
| 2010/0067214 A1 | 3/2010 | Hoelen et al. |
| 2010/0079061 A1 | 4/2010 | Tsai et al. |
| 2010/0090597 A1 | 4/2010 | Werners et al. |
| 2010/0110728 A1 | 5/2010 | Dubrow et al. |
| 2010/0123155 A1 | 5/2010 | Pickett et al. |
| 2010/0149814 A1 | 6/2010 | Zhai et al. |
| 2010/0155749 A1 | 6/2010 | Chen et al. |
| 2010/0167011 A1 | 7/2010 | Dubrow |
| 2010/0193806 A1 | 8/2010 | Byun |
| 2010/0208493 A1 | 8/2010 | Choi et al. |
| 2010/0265307 A1 | 10/2010 | Linton et al. |
| 2010/0265734 A1 | 10/2010 | Bulovic et al. |
| 2010/0283014 A1 | 11/2010 | Breen et al. |
| 2010/0283036 A1 | 11/2010 | Coe-Sullivan et al. |
| 2010/0283072 A1 | 11/2010 | Kazlas et al. |
| 2010/0289044 A1 | 11/2010 | Krames et al. |
| 2010/0314646 A1 | 12/2010 | Breen et al. |
| 2011/0103064 A1 | 5/2011 | Coe-Sullivan et al. |
| 2011/0127552 A1 | 6/2011 | Van Herpen et al. |
| 2011/0175054 A1 | 7/2011 | Ren et al. |
| 2011/0182056 A1 | 7/2011 | Trottier et al. |
| 2011/0186811 A1 | 8/2011 | Coe-Sullivan et al. |
| 2011/0199555 A1 | 8/2011 | Coe-Sullivan et al. |
| 2011/0233483 A1 | 9/2011 | Breen et al. |
| 2011/0309325 A1 | 12/2011 | Park et al. |
| 2012/0113671 A1 | 5/2012 | Sadasivan et al. |
| 2012/0113672 A1 | 5/2012 | Dubrow et al. |
| 2012/0187367 A1 | 7/2012 | Modi et al. |
| 2012/0189791 A1 | 7/2012 | Modi et al. |
| 2012/0313075 A1 | 12/2012 | Linton et al. |
| 2013/0032768 A1 | 2/2013 | Arbell et al. |
| 2013/0099212 A1 | 4/2013 | Jang et al. |
| 2013/0277643 A1 | 10/2013 | Williamson et al. |

FOREIGN PATENT DOCUMENTS

| | | |
|---|---|---|
| JP | 1260707 | 10/1989 |
| JP | H09304623 | 11/1997 |
| JP | 2002091352 | 3/2002 |
| JP | 2004-071357 | 3/2004 |
| JP | 2005038768 | 2/2005 |
| JP | 2006059723 | 3/2006 |
| JP | 2006073202 | 3/2006 |
| JP | 2006114900 A | 4/2006 |
| JP | 2006278082 | 10/2006 |
| JP | 2007073206 | 3/2007 |
| JP | 2007103099 | 4/2007 |
| JP | 2007103513 | 4/2007 |
| JP | 2007524726 A | 8/2007 |
| WO | WO2005004202 A2 | 1/2005 |
| WO | WO2008052318 A1 | 5/2008 |
| WO | WO2009002512 A1 | 12/2008 |
| WO | WO2009031084 A1 | 3/2009 |
| WO | WO2009137053 A1 | 11/2009 |
| WO | WO2009151515 A1 | 12/2009 |
| WO | WO2011020098 A1 | 2/2011 |
| WO | WO2011047385 A1 | 4/2011 |
| WO | WO2012021643 A2 | 2/2012 |
| WO | WO2012135744 A2 | 10/2012 |

OTHER PUBLICATIONS

CN2010880046736.2: 1$^{st}$ Office Action, mailed Mar. 7, 2014, in Chinese Patent Application No. CN2010880046736.2. (Chinese), which is the Chinese counterpart of parent U.S. Appl. No. 13/372,262, filed Feb. 13, 2012 (now U.S. Pat. No. 8,981,339).

CN2010880046736.2: Search Report, mailed Feb. 27, 2014, in Chinese Patent Application No. CN2010880046736.2, which is the Chinese counterpart of parent U.S. Appl. No. 13/372,262, filed Feb. 13, 2012 (now U.S. Pat. No. 8,981,339).

De Mello et al., "An Improved Experimental Determination of External Photoluminescence Quantum Efficiency", Adv. Mater., 9(3):230 (1997).

Extended European Search Report mailed Aug. 14, 2014 in European Patent Application No. 10 808 868.3, which is the European counterpart of parent application U.S. Appl. No. 13/372,262, filed Feb. 13, 2012 (now U.S. Pat. No. 8,981,339).

European Office Action mailed Dec. 3, 2015 in in European Patent Application No. 10 808 868.3, which is he European counterpart of parent U.S. Appl. No. 13/372,262, filed Feb. 13, 2012 (now U.S. Pat. No. 8,981,339).

Goetz, W., et al., "Development of Key Technologies for White Lighting Based on Light-Emitting diodes (LEDs)", Final Report issued Jun. 2004, DOE Award No. DE-FC26-01NT41251.

Jones-Bey, H., "Quantum-dot research targets general illumination", Laser Focus World (world wide web—laserfocusworld—dot—com), Mar. 2006.

(56) References Cited

OTHER PUBLICATIONS

JP2012524933: 1$^{st}$ Office Action, mailed Mar. 4, 2014, in Japanese Patent Application No. JP2012-524933, which is the Japanese counterpart of parent U.S. Appl. No. 13/372,262, filed Feb. 13, 2012 (now U.S. Pat. No. 8,981,339). (Japanese).

JP2012524933: Decision of Rejection, mailed Oct. 21, 2014, in Japanese Patent Application No. JP2012-524933, which is the Japanese counterpart of parent U.S. Appl. No. 13/372,262, filed Feb. 13, 2012 (now U.S. Pat. No. 8,981,339). (Japanese).

Lee, J., et al, "Full Color Emission from II-VI Semiconductor Quantum Dot-Polymer Composites" *Adv. Mater*. (2000), 12, No. 15, Aug. 2.

Mannan, O., "Creating White Light Utilizing Remote Phosphor Technology", *Future Electronics*, FTM, Oct. 2011, p. 26-27.

Masui, H., et al., "Effects of Phosphor Application Geometry on White Light-Emitting Diodes", *The Japan Society of Applied Physics*, vol. 45, No. 34, 2006, pp. L910-L912.

Mont, F., et al., "High-refractive-index Ti02-nanoparticle-loaded encapsulants for light-emitting diodes", *J. App. Phys*. (2008) vol. 103, No. 8, p. 83120.

Mueller-Mach, R., et al., "High-Power Phosphor-Converted Light-Emitting Diodes Based on III-Nitrides", *IEEE Journal on Selected Topics in Quantum Electronics*, vol. 8, No. 2, 339-345 (Mar./Apr. 2002).

Murray, Christopher, Thesis entitled "Synthesis and Characterization of II-VI Quantum Dots and Their Assembly into 3-D Quantum Dot Superlattices", Massachusetts Institute of Technology, Sep. 1995.

Murray, et al., "Synthesis and Characterization of Nearly Monodisperse CdE (E=S, Se, Te) Semiconductor Nanocrystallites" (Nov. 1993), *J. Am. Chem. Soc*., 115, pp. 8706-8715.

Narendran, N., et al., "Extracting phosphor-scattered photons to improve white LED efficiency", *Phys. Stat. Sol*. (a) 202, No. 6, R60-R62 (2005).

Ohno, Y., "Color Issues of White LEDs", Preprint: A section in "Solid State Light Emitting Diodes for General Illumination", OIDA Workshop Preliminary Report, Oct. 26-27, 2000, also in "OLEDS for General Illumination", OIDA Workshop Preliminary Report, Nov. 30-Dec. 1, 2000.

PCT International Search Report and Written Opinion, mailed Oct. 6, 2010, in grandparent International Application No. PCT/US2010/045624 of QD Vision, Inc.

Schlotter, P., et al., "Luminescence conversion of blue light emitting diodes", *Appl. Phys. A* 64, 417-418 (1997).

Song, H.; et al., "Photoluminescent (CdSe)ZnS quantum dot-polymethylmethacrylate polymer composite thin films in the visible range", *Nanotechnology* 18 (2007) 055401 (6 pp).

Steigerwald, D., et al., "Illumination With Solid State Lighting Technology", *IEEE Journal on Selected Topics in Quantum Electronics*, vol. 8, No. 2, 310-320 (Mar./Apr. 2002).

US Department of Energy, "Understanding Photometric Reports for SSL Products", PNNL-SA-67277 Jun. 2009.

U.S. Appl. No. 12/940,355: Nonfinal Office Action mailed Mar. 19, 2014 in copending U.S. Appl. No. 12/940,355.

U.S. Appl. No. 12/944,681: Nonfinal Office Action, mailed Mar. 19, 2013, in copending U.S. Appl. No. 12/944,681.

U.S. Appl. No. 12/944,681: Final Office Action mailed Dec. 5, 2013, in copending U.S. Appl. No. 12/944,681.

Ziegler, J., et al., "Silica-coated InP/ZnS Nanocrystals as Converter Material in White LEDs", *Adv, Mater*. 2008, 20, 4068-4073.

Ziegler, Jan, "Ph/D/ thesis Preparation and application of nanocrystals for white LEDs". Oct. 1, 2007. School of Chemical Sciences and Pharmacy, University of East Anglia, Norwich UK, Norwich, UK.

Chinese Notice of Issuance, mailed Dec. 16, 2015, in Chinese Patent Application No. CN201080046736.2, which is the Chinese counterpart of parent U.S. Appl. No. 13/372,262, filed Feb. 13, 2012 (now U.S. Pat. No. 8,981,339).

\* cited by examiner

LIGHTING DEVICES, AN OPTICAL COMPONENT FOR A LIGHTING DEVICE, AND METHODS

This application is a continuation of U.S. patent application Ser. No. 13/372,262 filed 13 Feb. 2012, which is a continuation of International Application No. PCT/US2010/045624 filed 16 Aug. 2010, which was published in the English language as PCT Publication No. WO 2011/020098 A1 on 17 Feb. 2011, which International Application claims priority to U.S. Application No. 61/234,179 filed 14 Aug. 2009. Each of the foregoing is hereby incorporated herein by reference in its entirety.

TECHNICAL FIELD OF THE INVENTION

The present invention relates to the technical field of lighting devices including nanoparticles, lighting fixtures and components including nanoparticles, and methods.

SUMMARY OF THE INVENTION

In accordance with one aspect of the present invention, there is provided a white-light emitting lighting device comprising an off-white light source, wherein the off-white light includes a spectral output including at least one spectral component in a first spectral region from about 360 nm to about 475 nm, at least one spectral component in a second spectral region from about 475 nm to about 575 nm, and at least one deficiency in at least one other spectral region, and an optical component that is positioned to receive at least a portion of the off-white light generated by the light source, the optical component comprising an optical material for converting at least a portion of the spectral output of the off-white light to one or more predetermined wavelengths, at least one of which has a wavelength in at least one deficient spectral region, such that light emitted by the lighting device comprises white light, wherein the optical material comprises quantum confined semiconductor nanoparticles.

In certain embodiments, a light source comprises one or more light sources.

In certain embodiments, a light source comprises one or more solid state semiconductor light emitting diodes.

In certain embodiments, the off-white light includes a spectral output including at least one spectral component in the blue spectral region (e.g., from about 400 nm to about 475 nm).

In certain embodiments, the off-white light includes a spectral output including at least one spectral component in the green spectral region (e.g., from about 500 nm to about 550 nm).

In certain embodiments, the off-white light includes a spectral output including at least one spectral component in the yellow spectral region (e.g., from about 550 nm to about 575 nm).

In certain embodiments, the off-white light includes a spectral output including at least one spectral component in the blue spectral region and at least one spectral component in the green and/or yellow spectral region.

In certain embodiments, the off-white light includes a spectral output including at least one spectral component in the blue spectral region and at least one spectral component in the green spectral region.

In certain embodiments, compensation of one or more spectral deficiencies of the light source by the optical component can alter the light output from the light source to achieve white light with a General Color Rendering Index ($R_a$). (General Color Rendering Index ($R_a$) is also referred to herein as CRI.) In certain embodiments, the CRI is at least 75. In certain embodiments, the CRI is at least 80. In certain embodiments, the CRI is at least 85. In certain embodiments, the CRI is at least 90. In certain embodiments, the CRI is at least 95.

In certain preferred embodiments, the white light output can have an R9 value that is a positive number. More preferably, the R9 value is at least 50. Most preferably, the R9 value is greater than 80.

In certain embodiments, the white light emitted by the white-light emitting device can have a predetermined CRI. In certain embodiments, the predetermined CRI is at least 75. In certain embodiments, the predetermined CRI is at least 80. In certain embodiments, the predetermined CRI is at least 85. In certain embodiments, the predetermined CRI is at least 90. In certain embodiments, the predetermined CRI is at least 95.

In certain embodiments, for example, where the light source emits off-white light with a spectral deficiency in the red spectral region, a predetermined wavelength can be in a range from about 575 nm to about 650 nm, from about 580 nm to about 630 nm, from about 590 nm to about 630 nm, from about 590 nm to about 630 nm, or from about 605 nm to about 620 nm.

In certain embodiments, for example, where the light source emits off-white light with a spectral deficiency in the cyan spectral region, a predetermined wavelength can be in a range from about 450 nm to about 500 nm.

In certain embodiments, for example, where the light source emits off-white light with one or more spectral deficiencies, the optical component can comprise an optical material including one or more different types of quantum confined semiconductor nanoparticles (based on composition, structure and/or size), wherein each different type of quantum confined semiconductor nanoparticle can convert a portion of the off-white light to a predetermined wavelength that is different from the predetermined wavelength emitted by at least one of any other type of quantum confined semiconductor nanoparticles included in the optical material.

In embodiments including two or more different types of quantum confined semiconductor nanoparticles that emit at different predetermined wavelengths, the different types of quantum confined semiconductor nanoparticles can be included in one or more different optical materials. In certain embodiments, different types of quantum confined semiconductor nanocrystals can be included in separate optical materials.

In certain embodiments including two or more different optical materials, such different optical materials can, for example, be included as separate layers of a layered arrangement and/or as separate features of a patterned layer.

In certain embodiments including two or more different types of quantum confined semiconductor nanoparticles that emit at different predetermined wavelengths, the different types of quantum confined semiconductor nanoparticles can be included in two or more different optical components in a stacked arrangement. In such embodiments, each optical component can include one or more optical materials as described above.

In embodiments including two or more different types of quantum confined semiconductor nanoparticles that emit at different predetermined wavelengths, white light emitted by the lighting device includes spectral components at such two or more different predetermined wavelengths. In such case, the two or more different predetermined wavelengths are selected to meet or compensate for one or more of the spectral deficiencies of the light source.

In certain embodiments wherein the off-white light source has more than one spectral deficiency, the desired white light output can be achieved by addressing a spectral deficiency in at least the red spectral region.

In certain embodiments, compensation of one or more spectral deficiencies of the light source by the optical component can alter the light output from the light source to achieve white light with a correlated color temperature (CCT). In certain embodiments, the white light can have a predetermined CCT. In certain embodiments, the white light output of the white-light emitting lighting device can have a CCT of at least about 2000K. In certain embodiments, the white light output of the white-light emitting lighting device can have a CCT of at least about 2500K. In certain embodiments, the white light output of the white-light emitting lighting device can have a CCT of at least about 3000K. In certain embodiments, the white light output of the white-light emitting lighting device can have a CCT of at least about 4000K. In certain embodiments, the white light output of the white-light emitting lighting device can have a CCT of at least about 5000K.

In certain embodiments, the lumens per watt efficiency of white light created from the off-white light source(s) is not substantially affected by alteration of the CCT within the range from about 2500K to about 3500K through use of the optical component. For example, the lumens per watt efficiency does not vary by more than 10 percentage points (as opposed to 10% of the initial lumens per watt efficiency value) as CCT is altered within the range from about 2500K to about 3500K.

In certain preferred embodiments, quantum confined semiconductor nanoparticles comprise semiconductor nanocrystals.

In certain embodiments, the quantum confined semiconductor nanoparticles have a solid state quantum efficiency of at least 40%. In certain embodiments, the quantum confined semiconductor nanoparticles have a solid state quantum efficiency of at least 50%. In certain embodiments, the quantum confined semiconductor nanoparticles have a solid state quantum efficiency of at least 60%. In certain embodiments, the quantum confined semiconductor nanoparticles have a solid state quantum efficiency of at least 70%. In certain embodiments, the quantum confined semiconductor nanoparticles have a solid state quantum efficiency of at least 80%. In certain embodiments, the quantum confined semiconductor nanoparticles have a solid state quantum efficiency of at least 90%.

In certain embodiments, the quantum confined semiconductor nanoparticles maintain at least 40% efficiency during operation of the solid state light emitting device.

In certain preferred embodiments, the optical material comprises quantum confined semiconductor nanoparticles capable of emitting red light.

In certain embodiments, for example, the white light emitted by the white-light emitting lighting device can have a predetermined General Color Rendering Index ($R_a$). In certain embodiments, the white light emitted by the lighting device has a General Color Rendering Index ($R_a$) of at least 75. In certain embodiments, the white light emitted by the lighting device has a General Color Rendering Index ($R_a$) of at least 80. In certain embodiments, the white light emitted by the lighting device has a General Color Rendering Index ($R_a$) of at least 85. In certain embodiments, the white light emitted by the lighting device has a General Color Rendering Index ($R_a$) of at least 90. In certain embodiments, the white light emitted by the lighting device has a General Color Rendering Index ($R_a$) of at least 95.

In certain preferred embodiments, the white light output can have an R9 value that is a positive number. More preferably, the R9 value is at least 50. Most preferably, the R9 value is greater than 80.

In certain embodiments, the lighting device maintains greater than 60% of the light source lumens per watt efficiency. In certain embodiments, the lighting device maintains greater than 70% of the light source lumens per watt efficiency. In certain embodiments, the lighting device maintains greater than 80% of the light source lumens per watt efficiency. In certain embodiments, the lighting device maintains greater than 90% of the light source lumens per watt efficiency. In certain embodiments, the lighting device maintains greater than 100% of the light source lumens per watt efficiency. In certain embodiments, the lighting device maintains greater than 110% of the light source lumens per watt efficiency.

In certain embodiments, the lumens per watt efficiency of white light created from the off-white light source(s) is not substantially affected by alteration of the CCT within the range from about 2500K to about 3500K through use of the optical component. For example, the lumens per watt efficiency does not vary by more than 10 percentage points from the initial value (as opposed to varying by 10% of the initial lumens per watt efficiency value) as CCT is altered within the range from about 2500K to about 3500K.

In certain embodiments, the optical material further comprises a host material in which the quantum confined semiconductor nanoparticles are distributed. In certain embodiments, quantum confined semiconductor nanoparticles are included in the optical material in an amount in a range from about 0.001 to about 5 weight percent of the weight of the host material. In certain embodiments, quantum confined semiconductor nanoparticles are included in the optical material in an amount in a range from about 0.5 to about 3 weight percent of the weight of the host material. In certain embodiments, quantum confined semiconductor nanoparticles are included in the optical material in an amount in a range from about 1 to about 3 weight percent of the weight of the host material. In certain embodiments, quantum confined semiconductor nanoparticles are included in the optical material in an amount in a range from about 1 to about 2 weight percent of the weight of the host material.

In certain embodiments of an optical material further including a host material, quantum confined semiconductor nanoparticles can be included in an optical material in an amount greater than about 5 weight percent of the host material. For example, the optical material can include from about 5 to about 20 weight percent quantum confined semiconductor nanoparticles based on the weight of the host material; the optical material can include from about 5 to about 15 weight percent quantum confined semiconductor nanoparticles based on the weight of the host material, the optical material can include from about 5 to about 10 weight percent quantum confined semiconductor nanoparticles based on the weight of the host material, etc.

Other concentrations of quantum confined semiconductor nanoparticles in an optical material outside of the above ranges may also be determined to be useful or desirable.

In certain embodiments, the optical material further comprises light scatterers.

In certain embodiments, the light scatterers comprise light scattering particles.

In certain embodiments, light scattering particles are included in the optical material in an amount in a range from about 0.001 to about 5 weight percent of the weight of the host material. In certain embodiments, light scattering particles are included in the optical material in an amount in a range from about 0.25 to about 4 weight percent of the weight of the host material. In certain embodiments, light scattering particles are included in the optical material in an amount in a range from about 0.5 to about 3 weight percent of the weight of the host material. In certain embodiments, light scattering particles are included in the optical material in an amount in a range from about 0.5 to about 2 weight percent of the weight of the host material. In certain embodiments, light scattering particles are included in the optical material in an amount in a range from about 1 to about 2 weight percent of the weight of the host material.

In certain embodiments, light scattering particles are included in the optical material in an amount greater than about 5 weight percent of the host material. For example, the optical material can include from about 5 to about 20 weight percent light scattering particles based on the weight of the host material; the optical material can include from about 5 to about 15 weight percent light scattering particles based on the weight of the host material, the optical material can include from about 5 to about 10 weight percent light scattering particles based on the weight of the host material, etc.

Other concentrations of light scattering particles in an optical material outside of the above ranges may also be determined to be useful or desirable.

In certain embodiments, an optical component further includes a support element. Preferably, the support element is optically transparent to light emitted from the light source and to light emitted from the nanoparticles.

In certain embodiments, the support element can include other optional layers.

In certain embodiments, the support element can include other optional features.

In certain embodiments, the optical material is at least partially encapsulated.

In certain embodiments, the optical material is fully encapsulated.

In certain embodiments, an optical component including a support element can serve as a cover plate for a lighting device.

In certain embodiments, the support element comprises a light diffuser component of a lighting device.

In certain embodiments, the support element is rigid.

In certain embodiments, the support element is flexible.

In certain embodiments, the optical material comprising quantum confined semiconductor nanoparticles is disposed over at least a portion of a surface of a support element. In certain embodiments, the optical material is disposed over at least a portion of a major surface of the support element. In certain embodiments, the optical material is disposed between the support element and a protective coating or cover that is optically transparent to light emitted by the light source and optical material.

In certain embodiments, the optical material is disposed as one or more layers over a predetermined area of a surface of the support element.

In certain embodiments, the layer comprises an optical material that further includes a host material in which the quantum confined semiconductor nanoparticles are distributed. In certain embodiments, the layer includes from about 0.001 to about 5 weight percent quantum confined semiconductor nanoparticles based on the weight of the host material.

In certain embodiments the layer includes greater than about 5 weight percent quantum confined semiconductor nanoparticles based on the weight of the host material. For example, the layer can include from about 5 to about 20 weight percent quantum confined semiconductor nanoparticles based on the weight of the host material; from about 5 to about 15 weight percent quantum confined semiconductor nanoparticles based on the weight of the host material, from about 5 to about 10 weight percent quantum confined semiconductor nanoparticles based on the weight of the host material, etc.

Other concentrations of quantum confined semiconductor nanoparticles in the layer outside of the above ranges may also be determined to be useful or desirable.

In certain embodiments, the layer further comprises light scatterers.

In certain embodiments, light scatterers are included in the layer in an amount in the range from about 0.001 to about 5 weight percent of the weight of the host material.

In certain embodiments the layer includes greater than about 5 weight percent light scattering particles based on the weight of the host material. For example, the layer can include from about 5 to about 20 weight percent light scattering particles based on the weight of the host material; from about 5 to about 15 weight percent light scattering particles based on the weight of the host material, from about 5 to about 10 weight percent light scattering particles based on the weight of the host material, etc.

Other concentrations of light scattering particles in the layer outside of the above ranges may also be determined to be useful or desirable.

In certain embodiments, a layer including optical material including a host material has a thickness, for example, from about 0.1 micron to about 1 cm. In certain embodiments, a layer including optical material including a host material has a thickness from about 0.1 to about 200 microns. In certain embodiments, a layer including optical material including a host material has a thickness from about 10 to about 200 microns. In certain embodiments, a layer including optical material including a host material has a thickness from about 30 to about 80 microns.

In certain preferred embodiments, the optical material is not in direct contact with the light source.

In certain preferred embodiments, the optical component is not in direct contact with the light source.

In certain embodiments, the temperature at the location of the nanoparticles in the solid state light emitting device during operation is 100° C. or less.

In certain embodiments, the temperature at the location of the nanoparticles in the solid state light emitting device during operation is 90° C. or less.

In certain embodiments, the temperature at the location of the nanoparticles in the solid state light emitting device during operation is 75° C. or less.

In certain embodiments, the temperature at the location of the nanoparticles in the solid state light emitting device during operation is 60° C. or less.

In certain embodiments, the temperature at the location of the nanoparticles in the solid state light emitting device during operation is 50° C. or less.

In certain embodiments, the temperature at the location of the nanoparticles in the solid state light emitting device during operation is 40° C. or less.

In certain embodiments, the temperature at the location of the nanoparticles in the solid state light emitting device during operation is in a range from about 30° C. to about 60° C.

In certain embodiments, the light source comprises an off-white light emitting solid state semiconductor light emitting diode or device (also referred to herein as an "LED").

In certain embodiments, the off-white light emitting LED comprises a blue light emitting semiconductor LED including a luminescent material for converting the blue LED light output to an off-white light output.

In certain embodiments, a luminescent material can comprise a phosphor. In certain embodiments, a luminescent material can comprise a color-converting dye. In certain embodiments, a luminescent material can comprise a color-converting pigment. In certain embodiments, a luminescent material can comprise a quantum confined semiconductor nanoparticle. In certain embodiments, a luminescent material can comprise one or more different types of luminescent material. In certain embodiments, the luminescent material comprises one or more different luminescent materials. In certain embodiments including two or more different luminescent materials, at least two of the different luminescent materials are capable of converting light from a light source to light with wavelengths that are distinct from each other. In certain embodiments wherein the luminescent material includes two or more different luminescent materials, the two or more different luminescent materials can be included in a mixture. In certain embodiments wherein the luminescent material includes two or more different luminescent materials, each of the luminescent materials can be included in the LED in a separate layer. In certain embodiments wherein the luminescent material includes three or more different luminescent materials, the three or more luminescent materials can be included in the LED in a combination of one or more layers, each of which can include one or more luminescent materials.

In certain embodiments, the luminescent material comprises a luminescent material that converts a portion of the blue light emitted by the LED to green. In certain preferred embodiments, the luminescent material comprises a phosphor that is capable of converting blue light to green.

In certain embodiments, the luminescent material comprises a luminescent material that converts a portion of the blue light emitted by the LED to yellow. In certain preferred embodiments, the luminescent material comprises a phosphor that is capable of converting blue light to yellow.

In certain embodiments, the LED includes a first luminescent material that converts a portion of the blue light emitted by the LED to yellow and a second luminescent material that converts a portion of the blue light emitted by the LED to green. In certain preferred embodiments, the first luminescent material comprises a phosphor that is capable of converting blue light to yellow and the second luminescent material comprises a phosphor that is capable of converting blue light to green.

In certain embodiments, one or more other luminescent materials can be utilized. In certain embodiments, one or more other luminescent materials comprise phosphors.

In certain embodiments, the off-white light emitting LED comprises a UV light emitting semiconductor LED including a luminescent material for converting the UV LED light output to off-white light.

In certain embodiments, a luminescent material can comprise a phosphor. In certain embodiments, a luminescent material can comprise a color-converting dye. In certain embodiments, a luminescent material can comprise a color-converting pigment. In certain embodiments, a luminescent material can comprise a quantum confined semiconductor nanoparticle. In certain embodiments, a luminescent material can comprise one or more different types of luminescent material. In certain embodiments, the luminescent material comprises one or more different luminescent materials. In certain embodiments including two or more different luminescent materials, at least two of the different luminescent materials are capable of converting light from a light source to light with wavelengths that are distinct from each other. In certain embodiments wherein the luminescent material includes two or more different luminescent materials, the two or more different luminescent materials can be included in a mixture. In certain embodiments wherein the luminescent material includes two or more different luminescent materials, each of the luminescent materials can be included in the LED in a separate layer. In certain embodiments wherein the luminescent material includes three or more different luminescent materials, the three or more luminescent materials can be included in the LED in a combination of one or more layers, each of which can include one or more luminescent materials.

In certain embodiments, the luminescent material comprises a luminescent material that converts a portion of the UV light emitted by the LED to green. In certain preferred embodiments, the luminescent material comprises a phosphor that is capable of converting UV light to green.

In certain embodiments, the luminescent material comprises a luminescent material that converts a portion of the UV light emitted by the LED to yellow. In certain preferred embodiments, the luminescent material comprises a phosphor that is capable of converting UV light to yellow.

In certain embodiments, the LED includes a first luminescent material that converts a portion of the UV light emitted by the LED to yellow and a second luminescent material that converts a portion of the UV light emitted by the LED to green. In certain preferred embodiments, the first luminescent material comprises a phosphor that is capable of converting UV light to yellow and the second luminescent material comprises a phosphor that is capable of converting UV light to green.

In certain embodiments, one or more other luminescent materials can be utilized. In certain embodiments, one or more other luminescent materials comprise phosphors.

In certain embodiments, a lighting device comprises a light source comprising an LED capable of emitting off-white light, wherein the off-white light includes a blue spectral component and a green and/or yellow spectral component and includes a deficiency in the red spectral region; and an optical component that is positioned to receive light emitted by the LED, the optical component comprising an optical material for converting at least a portion of the off-white light to light in the red spectral region with a wavelength in a range from about 595 nm to about 650 nm such that light emitted by the lighting device comprises white light, wherein the optical material comprises quantum confined semiconductor nanoparticles.

In certain embodiments, a lighting device comprises an off-white light emitting light source comprising an LED that emits off-white light, wherein the off-white light includes a blue spectral component and a green and/or yellow spectral component and includes a deficiency in the orange to red spectral region; and an optical component that is positioned to receive light emitted by the LED, the optical component comprising an optical material for converting at least a portion of the off-white light to light in the spectral region from about 575 nm to about 650 nm such that light emitted by the lighting device comprises white light, wherein the optical material comprises quantum confined semiconductor nanoparticles. In certain embodiments, for example, the optical material can convert at least a portion of the off-white light to light in the spectral region from about 575 nm to about 650 nm, from about 580 to about 630 nm, from about 590 nm to about 630 nm, from about 600 nm to about 620 nm, from about 605 nm to about 615 nm, etc.

In certain embodiments including an off-white light source that emits off-white light that includes an emission in the blue spectral region, at least 10% of the emission in the blue spectral region is converted by the quantum confined semiconductor nanoparticles.

In certain of such embodiments, at least 30% of the emission in the blue spectral region is converted by the quantum confined semiconductor nanoparticles.

In certain of such embodiments, at least 60% of the emission in the blue spectral region is converted by the quantum confined semiconductor nanoparticles.

In certain of such embodiments, no more than 95% of the emission in the blue spectral region is converted by the quantum confined semiconductor nanoparticles.

In certain of such embodiments, no more than 90% of the emission in the blue spectral region is converted by the quantum confined semiconductor nanoparticles.

In certain of such embodiments, from about 50% to about 80% of the emission in the blue spectral region is converted by the quantum confined semiconductor nanoparticles.

In certain embodiments, quantum confined semiconductor nanoparticles included in an optical material are cadmium free.

In certain embodiments, quantum confined semiconductor nanoparticles included in an optical material comprise a III-V semiconductor material.

In certain embodiments, quantum confined semiconductor nanoparticles included in an optical material comprise a semiconductor nanocrystal including a core comprising a semiconductor material and an inorganic shell disposed on at least a portion of a surface of the core.

In accordance with another aspect of the present invention, there is provided an optical component for creating white light with a predetermined CRI from a light source that emits off-white light, wherein the off-white light includes a spectral output including at least one spectral component in a first spectral region from about 360 nm to about 475 nm, at least one spectral component in a second spectral region from about 475 nm to about 575 nm, and a deficiency in at least one other spectral region, the optical component comprising an optical material for converting at least a portion of the off-white light output from the light source to one or more different predetermined wavelengths such that light emanating from the optical component comprises white light, wherein the optical material comprises quantum confined semiconductor nanoparticles.

In certain embodiments, a light source comprises one or more light sources.

In certain embodiments, a light source comprises one or more solid state semiconductor light emitting diodes.

In certain embodiments, the white light has a CRI of at least 75. In certain embodiments, the white light has a CRI of at least 80. In certain embodiments, the white light has a CRI of at least 85. In certain embodiments, the white light has a CRI of at least 90. In certain embodiments, the white light has a CRI of at least 95.

In certain embodiments, the white light output can have an R9 value that is a positive number. Preferably, the R9 value is at least 50. More preferably, the R9 value is greater than 80.

In certain embodiments, the white light has a predetermined CRI. In certain embodiments, the predetermined CRI is at least 75. In certain embodiments, the predetermined CRI is at least 80. In certain embodiments, the predetermined CRI is at least 85. In certain embodiments, the predetermined CRI is at least 90. In certain embodiments, the predetermined CRI is at least 95.

In certain preferred embodiments, the predetermined wavelength is selected to meet or compensate for at least one of the spectral deficiencies of the light source, for example, by supplementing the light output of the light source in at least one of the spectral deficiency regions.

In certain embodiments, for example, where the light source emits off-white light with a spectral deficiency in the orange to red spectral region, the predetermined wavelength can be in a range from about 575 nm to about 650 nm, from about 580 nm to about 630 nm, from about 590 nm to about 630 nm, from about 600 nm to about 620 nm, from about 605 nm to about 615 nm, etc.

In certain more preferred embodiments, the optical material includes one or more different types of quantum confined semiconductor nanoparticles wherein the different types can emit at one or more different predetermined wavelengths to compensate for one or more spectral deficiencies of the light output from the light source.

In certain embodiments, for example, where the light source emits off-white light with a spectral deficiency in the cyan spectral region, the predetermined wavelength can be in a range from about 450 nm to about 500 nm.

In certain embodiments, the optical component includes an optical material comprising one or more different types of quantum confined semiconductor nanoparticles (based on composition, structure and/or size), wherein each different type of quantum confined semiconductor nanoparticles emits light at predetermined wavelength that can be the same or different from the predetermined wavelength emitted by any other type of quantum confined semiconductor nanoparticles included in the optical material, and wherein one or more different predetermined wavelengths are selected such that the optical material will compensate for one or more spectral deficiencies of the light source. In certain embodiments including two or more different types of quantum confined semiconductor nanoparticles, at least two of the types are capable of emitting light at a predetermined wavelength that is different from that emitted by other types of quantum confined semiconductor nanoparticles that may be included in the optical component.

In certain embodiments including two or more different types of quantum confined semiconductor nanoparticles that emit at different predetermined wavelengths, the different types of quantum confined semiconductor nanoparticles can be included in one or more different optical materials.

In certain embodiments including two or more different types of quantum confined semiconductor nanoparticles that emit at different predetermined wavelengths, the different types of quantum confined semiconductor nanoparticles can be included in two or more different optical materials.

In certain embodiments including two or more different optical materials, such different optical materials can, for example, be included as separate layers of a layered arrangement and/or as separate features of a patterned layer.

In certain embodiments wherein the off-white light source has more than one spectral deficiency, the desired white light output can be achieved by addressing a spectral deficiency in at least the red spectral region.

In certain embodiments, compensation of one or more spectral deficiencies of the light source by the optical component can alter the light output from the light source to achieve white light with a correlated color temperature (CCT). In certain embodiments, the white light output of the white-light emitting lighting device can have a CCT of at least about 2000K. In certain embodiments, the white light output of the white-light emitting lighting device can have a CCT of at least about 2500K. In certain embodiments, the white light output of the white-light emitting lighting device can have a CCT of at least about 3000K. In certain embodiments, the white light output of the white-light emitting lighting device can have a CCT of at least about 4000K. In certain embodiments, the white light output of the white-light emitting lighting device can have a CCT of at least about 5000K. In certain embodiments, the white light can have a predetermined CCT.

In certain embodiments, the lumens per watt efficiency of white light created from the off-white light source(s) is not substantially affected by alteration of the CCT within the range from about 2500K to about 3500K through use of the optical component. For example, the lumens per watt efficiency does not vary by more than 10 percentage points (as opposed to 10% of the initial lumens per watt efficiency value) as CCT is altered within the range from about 2500K to about 3500K.

In certain preferred embodiments, quantum confined semiconductor nanoparticles comprise semiconductor nanocrystals.

In certain embodiments, the quantum confined semiconductor nanoparticles have a solid state quantum efficiency of at least 40%. In certain embodiments, the quantum confined semiconductor nanoparticles have a solid state quantum efficiency of at least 50%. In certain embodiments, the quantum confined semiconductor nanoparticles have a solid state quantum efficiency of at least 60%. In certain embodiments, the quantum confined semiconductor nanoparticles have a solid state quantum efficiency of at least 70%. In certain embodiments, the quantum confined semiconductor nanoparticles have a solid state quantum efficiency of at least 80%. In certain embodiments, the quantum confined semiconductor nanoparticles have a solid state quantum efficiency of at least 90%.

In certain embodiments, the quantum confined semiconductor nanoparticles maintain at least 40% efficiency during use of the optical component.

In certain preferred embodiments, the optical material comprises quantum confined semiconductor nanoparticles capable of emitting red light. In other certain preferred embodiments, the optical material comprises quantum confined semiconductor nanoparticles capable of emitting light in the orange to red spectral region.

In certain embodiments, the optical material further comprises a host material in which the quantum confined semiconductor nanoparticles are distributed. In certain embodiments, quantum confined semiconductor nanoparticles are included in the optical material in an amount in a range from about 0.001 to about 5 weight percent of the weight of the host material. In certain embodiments, quantum confined semiconductor nanoparticles are included in the optical material in an amount in a range from about 0.5 to about 3 weight percent of the weight of the host material. In certain embodiments, quantum confined semiconductor nanoparticles are included in the optical material in an amount in a range from about 1 to about 3 weight percent of the weight of the host material. In certain embodiments, quantum confined semiconductor nanoparticles are included in the optical material in an amount in a range from about 1 to about 2 weight percent of the weight of the host material.

In certain embodiments of an optical material further including a host material, quantum confined semiconductor nanoparticles can be included in an optical material in an amount greater than about 5 weight percent of the host material. For example, the optical material can include from about 5 to about 20 weight percent quantum confined semiconductor nanoparticles based on the weight of the host material; the optical material can include from about 5 to about 15 weight percent quantum confined semiconductor nanoparticles based on the weight of the host material, the optical material can include from about 5 to about 10 weight percent quantum confined semiconductor nanoparticles based on the weight of the host material, etc.

Other concentrations of quantum confined semiconductor nanoparticles in an optical material outside of the above ranges may also be determined to be useful or desirable.

In certain embodiments, the optical material further comprises light scatterers.

In certain embodiments, the light scatterers comprise light scattering particles.

In certain embodiments, light scattering particles are included in the optical material in an amount in a range from about 0.001 to about 5 weight percent of the weight of the host material. In certain embodiments, light scattering particles are included in the optical material in an amount in a range from about 0.25 to about 4 weight percent of the weight of the host material. In certain embodiments, light scattering particles are included in the optical material in an amount in a range from about 0.5 to about 3 weight percent of the weight of the host material. In certain embodiments, light scattering particles are included in the optical material in an amount in a range from about 0.5 to about 2 weight percent of the weight of the host material. In certain embodiments, light scattering particles are included in the optical material in an amount in a range from about 1 to about 2 weight percent of the weight of the host material.

In certain embodiments, light scattering particles are included in the optical material in an amount greater than about 5 weight percent of the host material. For example, the optical material can include from about 5 to about 20 weight percent light scattering particles based on the weight of the host material; the optical material can include from about 5 to about 15 weight percent light scattering particles based on the weight of the host material, the optical material can include from about 5 to about 10 weight percent light scattering particles based on the weight of the host material, etc.

Other concentrations of light scattering particles in an optical material outside of the above ranges may also be determined to be useful or desirable.

In certain embodiments, an optical component further includes a support element. Preferably, the support element is optically transparent to light emitted from the light source and to light emitted from the nanoparticles.

In certain embodiments, an optical component including a support element can serve as a cover plate for a lighting device.

In certain embodiments, the support element comprises a light diffuser component of a lighting device.

In certain embodiments, the support element is rigid.

In certain embodiments, the support element is flexible.

In certain embodiments, the optical material comprising quantum confined semiconductor nanoparticles is disposed over at least a portion of a surface of a support element. In certain embodiments, the optical material comprising quantum confined semiconductor nanoparticles is disposed over at least a portion of a major surface of a support element. In certain embodiments, the optical material is disposed between the support element and a protective coating or cover that is optically transparent to light emitted by the light source and optical material.

In certain embodiments, the optical material is disposed as one or more layers over a predetermined area of the surface of the support element.

In certain embodiments, the layer comprises an optical material that further includes a host material in which the quantum confined semiconductor nanoparticles are distributed. In certain embodiments, the layer includes from about 0.001 to about 5 weight percent quantum confined semiconductor nanoparticles based on the weight of the host material.

In certain embodiments the layer includes greater than about 5 weight percent quantum confined semiconductor nanoparticles based on the weight of the host material. For example, the layer can include from about 5 to about 20 weight percent quantum confined semiconductor nanoparticles based on the weight of the host material; from about 5 to about 15 weight percent quantum confined semiconductor nanoparticles based on the weight of the host material, from about 5 to about 10 weight percent quantum confined semiconductor nanoparticles based on the weight of the host material, etc.

Other concentrations of quantum confined semiconductor nanoparticles in the layer outside of the above ranges may also be determined to be useful or desirable.

In certain embodiments, the layer further comprises light scatterers.

In certain embodiments, light scatterers are included in the layer in an amount in the range from about 0.001 to about 5 weight percent of the weight of the host material.

In certain embodiments the layer includes greater than about 5 weight percent light scattering particles based on the weight of the host material. For example, the layer can include from about 5 to about 20 weight percent light scattering particles based on the weight of the host material; from about 5 to about 15 weight percent light scattering particles based on the weight of the host material, from about 5 to about 10 weight percent light scattering particles based on the weight of the host material, etc.

Other concentrations of light scattering particles in the layer outside of the above ranges may also be determined to be useful or desirable.

In certain embodiments, a layer including optical material including a host material has a thickness, for example, from about 0.1 micron to about 1 cm. In certain embodiments, a layer including optical material including a host material has a thickness from about 0.1 to about 200 microns. In certain embodiments, a layer including optical material including a host material has a thickness from about 10 to about 200 microns. In certain embodiments, a layer including optical material including a host material has a thickness from about 30 to about 80 microns.

In certain embodiments wherein an optical component receives light from an off-white light source that emits light that includes an emission in the blue spectral region, at, the optical component can convert at least 10% of the emission in the blue spectral region to one or more predetermined wavelengths.

In certain of such embodiments, the optical component can convert at least 30% of the emission in the blue spectral region to one or more predetermined wavelengths.

In certain of such embodiments, the optical component can convert at least 60% of the emission in the blue spectral region to one or more predetermined wavelengths.

In certain of such embodiments, no more than 95% of the emission in the blue spectral region is converted by the quantum confined semiconductor nanoparticles.

In certain of such embodiments, no more than 90% of the emission in the blue spectral region is converted by the quantum confined semiconductor nanoparticles.

In certain of such embodiments, the optical component can convert from about 50% to about 80% of the emission in the blue spectral region to one or more predetermined wavelengths.

In certain of such embodiments, the optical component can convert from about 60% to about 80% of the emission in the blue spectral region to one or more predetermined wavelengths.

In certain embodiments, quantum confined semiconductor nanoparticles included in an optical material are cadmium free.

In certain embodiments, quantum confined semiconductor nanoparticles included in an optical material comprise a III-V semiconductor material.

In certain embodiments, quantum confined semiconductor nanoparticles included in an optical material comprise a semiconductor nanocrystal including a core comprising a semiconductor material and an inorganic shell disposed on at least a portion of a surface of the core.

In certain embodiments, the optical material is at least partially encapsulated.

In certain embodiments, the optical material is fully encapsulated.

In accordance with another aspect of the present invention, there is provided a lighting fixture adapted to receive one or more light sources, wherein the fixture includes an optical component that is positioned in the fixture relative to the position of the one or more light sources such that at least a portion of the light generated by the one or more light sources passes into the optical component before light output is emitted from the fixture, wherein the optical component comprises an optical component taught herein.

In certain embodiments, the lighting fixture includes a housing adapted to receive one or more light sources, wherein the optical component is positioned in the fixture relative to the position of the one or more light sources to receive at least a portion, and preferably all, of the light emitted by the one or more light sources.

In certain embodiments, a light source comprises an off-white light emitting LED. In certain of such embodiments, the light output from the lighting fixture is white light with a predetermined CRI. In certain embodiments, the CRI is at least 75. In certain embodiments, the CRI is at least 80. In certain embodiments, the CRI is at least 85. In certain embodiments, the predetermined CRI is at least 90. In certain embodiments, the predetermined CRI is at least 95.

In certain preferred embodiments, the white light output can have an R9 value that is a positive number. More preferably, the R9 value is at least 50. Most preferably, the R9 value is greater than 80.

In certain of embodiments, the light output from the lighting fixture is white light with a predetermined CCT. In certain embodiments, the CCT is at least 2000K. In certain embodiments, the predetermined CCT is at least 2500K. In certain embodiments, the predetermined CCT is at least 3000K. In certain embodiments, the predetermined CCT is at least 4000K. In certain embodiments, the predetermined CCT is at least 5000K.

In accordance with a further aspect of the present invention, there is provided a cover plate for use with lighting fixture for use with one or more light sources, the cover plate being adapted for attachment to the lighting fixture to receive at least portion of the light emitted from the one or more light sources, the cover plate comprising an optical component described herein.

In accordance with a further aspect of the present invention, there is provided a cover plate adapted for attachment to lighting device including one or more solid state semiconductor light emitting diodes, the cover plate comprising an optical component described herein.

The cover plate is preferably adapted for attachment to the device so as to receive at least portion of the light emitted from the one or more solid state semiconductor light emitting diodes.

In certain embodiments, a light source comprises a solid state semiconductor light emitting diode.

In certain embodiments the lighting device comprises a lamp.

In accordance with yet a further aspect of the present invention, there is provided a method for creating white light with a predetermined CRI from an off-white light source, the method comprising passing at least a portion of the off-white light emitted by the light source, wherein the off-white light includes a spectral output including at least one spectral component in a first spectral region from about 360 nm to about 475 nm, at least one spectral component in a second spectral region from about 475 nm to about 575 nm, and a deficiency in at least one other spectral region, into an optical material to convert at least a portion of the off-white light into one or more emissions in a range from about 575 to about 650 nm to obtain white light with the predetermined CRI, the optical material comprising quantum confined semiconductor nanoparticles.

In certain embodiments, the off-white light includes a blue spectral component and a green and/or yellow spectral component.

In certain embodiments, a light source comprises one or more light sources.

In certain embodiments, a light source comprises one or more solid state semiconductor light emitting diodes.

In certain embodiments, the predetermined CRI is at least 75. In certain embodiments, the predetermined CRI is at least 80. In certain embodiments, the predetermined CRI is at least 85. In certain embodiments, the predetermined CRI is at least 90. In certain embodiments, the predetermined CRI is at least 95. Preferably the optical material spaced from, and not on a surface of the light emitting device.

In certain preferred embodiments, the white light output can have an R9 value that is a positive number. More preferably, the R9 value is at least 50. Most preferably, the R9 value is greater than 80.

In certain embodiments, for example, the optical material can convert at least a portion of the off-white light into one or more emissions in a range from about 580 nm to about 630 nm, from about 590 nm to about 630 nm, from about 600 nm to about 620 nm, from about 605 nm to about 615 nm, etc.

In certain embodiments, one or more different types of quantum confined semiconductor nanoparticles that emit at different predetermined wavelengths can be included in one or more different optical materials.

In certain embodiments including two or more different types of quantum confined semiconductor nanoparticles that emit at different predetermined wavelengths, the different types of quantum confined semiconductor nanoparticles can be included in two or more different optical materials.

In certain embodiments, the method includes an optical material described herein.

In certain embodiments, the method includes an optical component taught herein.

In certain embodiments, including two or more different optical materials, such different optical materials can, for example, be included as separate layers of a layered arrangement and/or as separate features of a patterned layer.

In accordance with yet a further aspect of the present invention, there is provided a method for improving at least one color characteristic of an off-white light-emitting semiconductor light emitting device having a spectral output including at least one spectral component in a first spectral region from about 360 nm to about 475 nm, at least one spectral component in a second spectral region from about 475 nm to about 575 nm, and at least one deficiency in at least one other spectral region, the method comprising passing at least a portion of the off-white light into an optical material to convert at least a portion of the off-white light into one or more emissions in at least one of the deficient spectral regions to create white light, the optical material comprising quantum confined semiconductor nanoparticles.

In certain embodiments, a light source comprises one or more light sources.

In certain embodiments, a light source comprises one or more solid state semiconductor light emitting diodes.

In certain embodiments, the method includes an optical material taught herein.

In certain embodiments, the method includes an optical component taught herein.

In certain embodiments, the optical material comprises red-emitting quantum confined semiconductor nanoparticles.

In certain embodiments, the optical material comprises two or more different types of quantum confined semiconductor nanoparticles, wherein each different type of quantum confined semiconductor nanoparticles emits light at predetermined wavelength that is different from the predetermined wavelength emitted by at least one of another type of quantum confined semiconductor nanoparticles included in the optical material, and wherein one or more different predetermined wavelengths are selected such that the optical material will compensate for one or more spectral deficiencies of the off-white light-emitting semiconductor light emitting device.

In accordance with yet a further aspect of the present invention, there is provided a method for improving the lumens per watt efficiency of white light created from an off-white light emitting light source, wherein the off-white light includes a spectral output including at least one spectral component in a first spectral region from about 360 nm to about 475 nm, at least one spectral component in a second spectral region from about 475 nm to about 575 nm, and a deficiency in at least one other spectral region, the method comprising passing at least a portion of the off-white light into an optical material to convert at least a portion of the off-white light into one or more emissions in a range from about 575 nm to about 650 nm, the optical material comprising quantum confined semiconductor nanoparticles.

In certain embodiments, a light source comprises one or more light sources.

In certain embodiments, a light source comprises one or more solid state semiconductor light emitting diodes.

In certain embodiments, the method includes an optical material taught herein.

In certain embodiments, the method includes an optical component taught herein.

The foregoing, and other aspects and embodiments described herein all constitute embodiments of the present invention.

In certain preferred embodiments of the inventions described herein, the optical material and/or optical component is in optical communication with, but not in direct physical contact with, the light emitting device or other light source.

As used herein, "encapsulation" refers to protection against a particular element or compound, for example, oxygen and/or water. In certain embodiments, encapsulation can be complete (also referred to herein as full encapsulation). In certain embodiments, encapsulation can be less than complete (also referred to herein as partial encapsulation).

Additional information concerning quantum confined semiconductor nanoparticles, light scatterers, host materials, support elements, other features and elements of the foregoing, and other information useful with the present inventions is provided below.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

Figure 1:
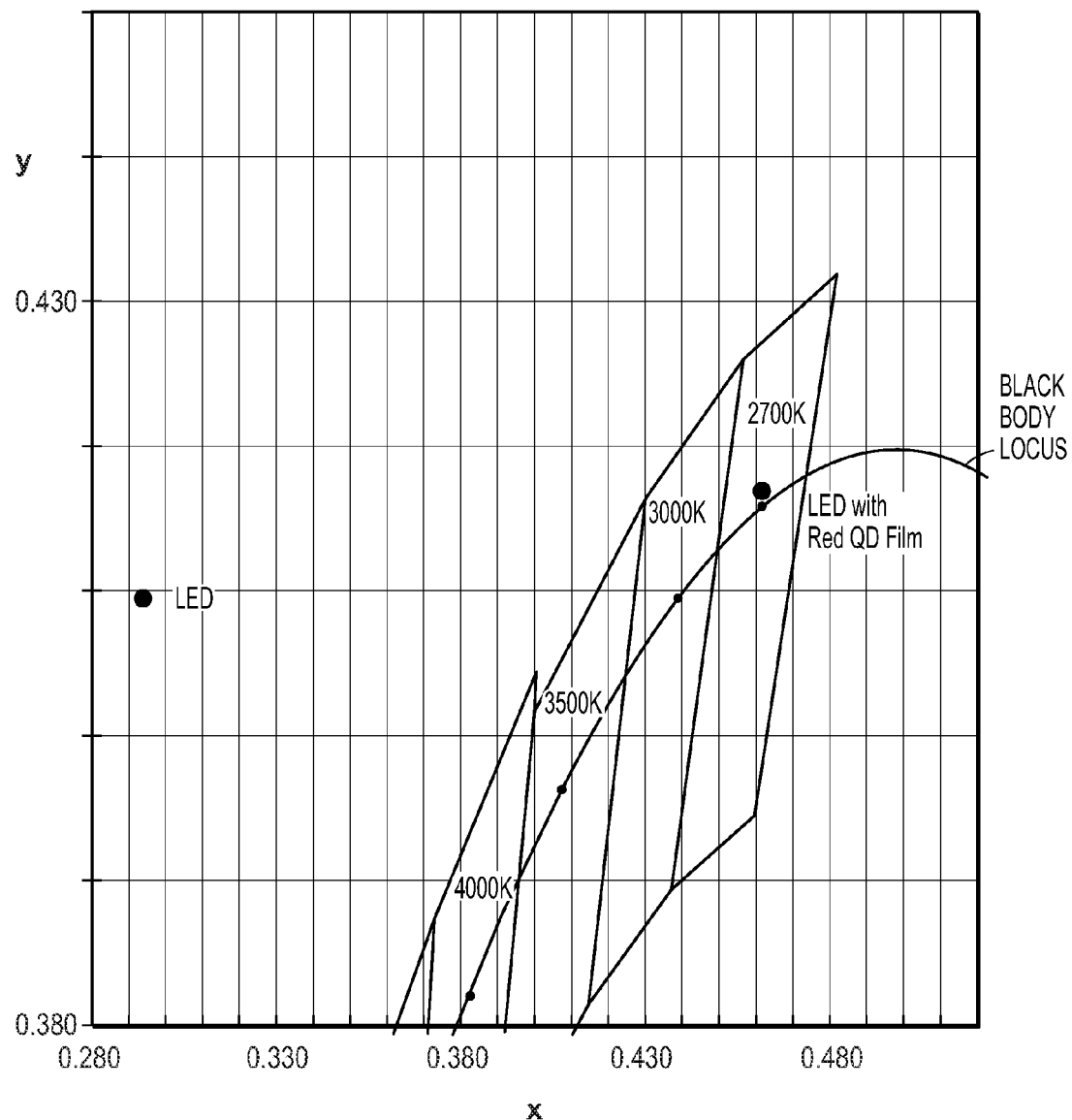
FIG. 1. depicts a region of the 1931 CIE Chromaticity diagram. Also plotted are the blackbody radiation curve, Correlated Color Temperature points, and ANSI bins around the color temperatures. Data for Example 2 are also included FIG. 2. depicts a region of the 1931 CIE Chromaticity diagram. Also plotted are the blackbody radiation curve, Correlated Color Temperature points, and ANSI bins around the color temperatures. Data for Example 3 are also included

The attached figures are simplified representations presented for purposes of illustration only.

For a better understanding to the present invention, together with other advantages and capabilities thereof, reference is made to the following disclosure and appended claims in connection with the above-described drawings.

DETAILED DESCRIPTION OF THE INVENTION

Various aspects and embodiments of the present inventions will be further described in the following detailed description.

Quantum confined semiconductor nanoparticles can confine electrons and holes and have a photoluminescent property to absorb light and re-emit different wavelength light. Color characteristics of emitted light from quantum confined semiconductor nanoparticles depend on the size of the quantum confined semiconductor nanoparticles and the chemical composition of the quantum confined semiconductor nanoparticles.

Quantum confined semiconductor nanoparticles include at least one type of quantum confined semiconductor nanoparticle with respect to chemical composition, structure, and size. The type(s) of quantum confined semiconductor nanoparticles included in an optical component in accordance with the invention are determined by the wavelength of light to be converted and the wavelengths of the desired light output. As discussed herein, quantum confined semiconductor nanoparticles may or may not include a shell and/or a ligand on a surface thereof. In certain embodiments, a shell and/or ligand can passivate quantum confined semiconductor nanoparticles to prevent agglomeration or aggregation to overcome the Van der Waals binding force between the nanoparticles. In certain embodiments, the ligand can comprise a material having an affinity for any host material in which a quantum confined semiconductor nanoparticle may be included. As discussed herein, in certain embodiments, a shell comprises an inorganic shell.

In certain embodiments, one or more different types of quantum confined semiconductor nanoparticles (based on composition, structure and/or size) may be included in a host material, wherein each type is selected to obtain light having a predetermined color.

In accordance with one aspect of the present invention, there is provided a white-light emitting lighting device comprising an off-white light emitting light source, wherein the off-white light includes a spectral output including at least one spectral component in a first spectral region from about 360 nm to about 475 nm, at least one spectral component in a second spectral region from about 475 nm to about 575 nm, and at least one deficiency in at least one other spectral region, and an optical component that is positioned to receive at least a portion of the off-white light generated by the light source, the optical component comprising an optical material for converting at least a portion of the off-white light to one or more predetermined wavelengths, at least one of which has a wavelength in at least one deficient spectral region, such that light emitted by the lighting device comprises white light, wherein the optical material comprises quantum confined semiconductor nanoparticles.

In certain embodiments, off-white light includes a blue spectral component and a green and/or yellow spectral component and further has a deficiency in at least one other spectral region.

In certain embodiments, a white-light emitting lighting device comprises a lamp.

In certain embodiments, a white-light emitting lighting device comprises a lighting unit comprising a lighting fixture including one or more light sources.

In certain embodiments, a light source comprises one or more light sources.

In certain embodiments, a light source comprises one or more solid state semiconductor light emitting diodes.

In certain embodiments, for example, wherein the light source emits off-white light with more than one spectral deficiency, the optical component can comprise an optical material including one or more different types of quantum confined semiconductor nanoparticles (based on composition, structure and/or size), wherein each different type of quantum confined semiconductor nanoparticle can convert a portion of the off-white light to a predetermined wavelength that is different from the predetermined wavelength emitted by at least one of any other type of quantum confined semiconductor nanoparticles included in the optical material.

In certain embodiments including two or more different types of quantum confined semiconductor nanoparticles that emit at different predetermined wavelengths, the different types of quantum confined semiconductor nanoparticles can be included in one or more different optical materials.

In certain embodiments including two or more different types of quantum confined semiconductor nanoparticles that emit at different predetermined wavelengths, the different types of quantum confined semiconductor nanoparticles can be included in two or more different optical materials.

In certain embodiments including two or more different optical materials, such different optical materials can, for example, be included as separate layers of a layered arrangement and/or as separate features of a patterned layer.

In other embodiments including two or more different types of quantum confined semiconductor nanoparticles that emit at different predetermined wavelengths, the different types of quantum confined semiconductor nanoparticles can be included in two or more different optical components in a stacked arrangement. In such embodiments, each optical component can include one or more optical materials as described above.

In embodiments including two or more different types of quantum confined semiconductor nanoparticles that emit at different predetermined wavelengths, light emitted by the lighting device includes light emission that is supplemented with light emission at one or more different predetermined wavelengths. In such case, the two or more different predetermined wavelengths are selected to meet or compensate for one or more of the spectral deficiencies of the light source.

For example, in certain embodiments, off-white-emitting semiconductor LEDs emit off-white light with spectral deficiencies, for example, in the red, orange, and/or cyan spectral regions of the spectrum.

In certain embodiments, a lighting device can include an optical component for adding saturated red light to the light source light output. This can provide more saturated red color for the same power input, or equivalent red power for lower electrical power consumption.

In certain embodiments, a lighting device can include an optical component for adding light in the orange to red spectral region (e.g., from about 575 nm to about 650 nm) to the light source output.

In certain embodiments, a lighting device can add cyan light to the light source light output.

In certain embodiments, compensation of one or more spectral deficiencies of the light source by the optical component can alter the light output from the light source to achieve white light with a General Color Rendering Index ($R_a$). (General Color Rendering Index ($R_a$) is also referred to herein as CRI.) In certain embodiments, the CRI is at least 75. In certain embodiments, the CRI is at least 80. In certain embodiments, the CRI is at least 85. In certain embodiments, the CRI is at least 90. In certain embodiments, the CRI is at least 95.

In certain preferred embodiments, the white light output can have an R9 value that is a positive number. More preferably, the R9 value is at least 50. Most preferably, the R9 value is greater than 80.

In certain embodiments, the white light emitted by the white-light emitting device can have a predetermined CRI. In certain embodiments, the predetermined CRI is at least 75. In certain embodiments, the predetermined CRI is at least 80. In certain embodiments, the predetermined CRI is at least 85. In certain embodiments, the predetermined CRI is at least 90. In certain embodiments, the predetermined CRI is at least 95.

In certain embodiments, compensation of one or more spectral deficiencies of the light source by the optical component can alter the light output from the light source to achieve white light with a correlated color temperature (CCT). In certain embodiments, the white light can have a predetermined CCT. In certain embodiments, the white light output of the white-light emitting lighting device can have a CCT of at least about 2000K. In certain embodiments, the white light output of the white-light emitting lighting device can have a CCT of at least about 2500K. In certain embodiments, the white light output of the white-light emitting lighting device can have a CCT of at least about 3000K. In certain embodiments, the white light output of the white-light emitting lighting device can have a CCT of at least about 4000K. In certain embodiments, the white light output of the white-light emitting lighting device can have a CCT of at least about 5000K.

In certain preferred embodiments, quantum confined semiconductor nanoparticles comprise semiconductor nanocrystals.

In certain embodiments, the quantum confined semiconductor nanoparticles have a solid state quantum efficiency of at least 40%. In certain embodiments, the quantum confined semiconductor nanoparticles have a solid state quantum efficiency of at least 50%. In certain embodiments, the quantum confined semiconductor nanoparticles have a solid state quantum efficiency of at least 60%. In certain embodiments, the quantum confined semiconductor nanoparticles have a solid state quantum efficiency of at least 70%. In certain embodiments, the quantum confined semiconductor nanoparticles have a solid state quantum efficiency of at least 80%. In certain embodiments, the quantum confined semiconductor nanoparticles have a solid state quantum efficiency of at least 90%.

In certain embodiments, the quantum confined semiconductor nanoparticles maintain at least 40% efficiency during use of the optical component.

In certain preferred embodiments, the optical material comprises quantum confined semiconductor nanoparticles capable of emitting red light. In other certain preferred embodiments, the optical material comprises quantum confined semiconductor nanoparticles capable of emitting light in the orange to red spectral region.

In certain embodiments, an optical material comprises quantum confined semiconductor nanoparticles distributed in a host material. Preferably, the host material comprises a solid host material.

Examples of a host material useful in various embodiments and aspect of the inventions described herein include polymers, monomers, resins, binders, glasses, metal oxides, and other nonpolymeric materials. Preferred host materials include polymeric and non-polymeric materials that are at least partially transparent, and preferably fully transparent, to preselected wavelengths of light. In certain embodiments, the preselected wavelengths can include wavelengths of light in the visible (e.g., 400-700 nm) region of the electromagnetic spectrum. Preferred host materials include cross-linked polymers and solvent-cast polymers. Examples of preferred host materials include, but are not limited to, glass or a transparent resin. In particular, a resin such as a non-curable resin, heat-curable resin, or photocurable resin is suitably used from the viewpoint of processability. As specific examples of such a resin, in the form of either an oligomer or a polymer, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like. Other suitable host materials can be identified by persons of ordinary skill in the relevant art.

In certain embodiments and aspects of the inventions contemplated by this disclosure, a host material comprises a photocurable resin. A photocurable resin may be a preferred host material in certain embodiments, e.g., embodiments in which the composition is to be patterned. As a photo-curable resin, a photo-polymerizable resin such as an acrylic acid or methacrylic acid based resin containing a reactive vinyl group, a photo-crosslinkable resin which generally contains a photo-sensitizer, such as polyvinyl cinnamate, benzophenone, or the like may be used. A heat-curable resin may be used when the photo-sensitizer is not used. These resins may be used individually or in combination of two or more.

In certain embodiments and aspects of the inventions contemplated by this disclosure, a host material comprises a solvent-cast resin. A polymer such as a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like can be dissolved in solvents known to those skilled in the art. Upon evaporation of the solvent, the resin forms a solid host material for the semiconductor nanoparticles.

In certain embodiments, light scatterers and/or other additives (e.g., wetting or leveling agents) can also be included in optical material.

Examples of light scatterers (also referred to herein as scatterers or light scattering particles) that can be used in the embodiments and aspects of the inventions described herein, include, without limitation, metal or metal oxide particles, air bubbles, and glass and polymeric beads (solid or hollow). Other light scatterers can be readily identified by those of ordinary skill in the art. In certain embodiments, scatterers have a spherical shape. Preferred examples of scattering particles include, but are not limited to, $TiO_2$, $SiO_2$, $BaTiO_3$, $BaSO_4$, and ZnO. Particles of other materials that are non-reactive with the host material and that can increase the absorption pathlength of the excitation light in the host material can be used. In certain embodiments, light scatterers may have a high index of refraction (e.g., $TiO_2$, $BaSO_4$, etc) or a low index of refraction (gas bubbles).

Selection of the size and size distribution of the scatterers is readily determinable by those of ordinary skill in the art. The size and size distribution can be based upon the refractive index mismatch of the scattering particle and the host material in which it the light scatterer is to be dispersed, and the preselected wavelength(s) to be scattered according to Rayleigh scattering theory. The surface of the scattering particle may further be treated to improve dispersability and stability in the host material. In one embodiment, the scattering particle comprises $TiO_2$ (R902+ from DuPont (0.405 µm median particle size), in a concentration in a range from about 0.001 to about 5% by weight. In certain preferred embodiments, the concentration range of the scatterers is between 0.1% and 2% by weight. In certain embodiments, a light scattering particle with a 0.2 µm particle size can also be used. Other sizes and concentrations of light scattering particles in an optical material may also be determined to be useful or desirable.

In certain embodiments, an optical material including quantum confined semiconductor nanoparticles and a host material can be formed from an ink comprising quantum confined semiconductor nanoparticles and a liquid vehicle, wherein the liquid vehicle comprises a composition including one or more functional groups that are capable of being cross-linked. The functional units can be cross-linked, for example, by UV treatment, thermal treatment, or another cross-linking technique readily ascertainable by a person of ordinary skill in a relevant art. In certain embodiments, the composition including one or more functional groups that are capable of being cross-linked can be the liquid vehicle itself. In certain embodiments, it can be a co-solvent. In certain embodiments, it can be a component of a mixture with the liquid vehicle. In certain embodiments, the ink can further include light scatterers.

In certain preferred embodiments of the inventions contemplated by this disclosure, quantum confined semiconductor nanoparticles (e.g., semiconductor nanocrystals) are distributed within the host material as individual particles.

In certain embodiments of an optical material further including a host material, quantum confined semiconductor nanoparticles can be included in an optical material in an amount from about 0.001 to about 5 weight percent of the host material. In certain preferred embodiments, the optical material includes from about 0.1 to about 3 weight percent quantum confined semiconductor nanoparticles based on the weight of the host material. In certain more preferred embodiments, the composition includes from about 0.5 to about 3 weight percent quantum confined semiconductor nanoparticles based on the weight of the host material. In certain embodiments including light scatterers, the optical material includes from about 0.001 to about 5 weight percent scatterers based on the weight of the optical material.

In certain embodiments of an optical material further including a host material, quantum confined semiconductor nanoparticles can be included in an optical material in an amount greater than about 5 weight percent of the host material. For example, the optical material can include from about 5 to about 20 weight percent quantum confined semiconductor nanoparticles based on the weight of the host material; the optical material can include from about 5 to about 15 weight percent quantum confined semiconductor nanoparticles based on the weight of the host material, the optical material can include from about 5 to about 10 weight percent quantum confined semiconductor nanoparticles based on the weight of the host material, etc.

Other concentrations of quantum confined semiconductor nanoparticles in an optical material outside of the above ranges may also be determined to be useful or desirable.

In certain aspects and embodiments of the inventions taught herein, the optical component can further include a support element. In certain embodiments, optical material is disposed on the support element. In certain embodiments, optical material is disposed on a predetermined area of a surface of the support.

In certain embodiments, the support element is substantially optically transparent. In certain embodiments, the support element is at least 90% transparent. In certain embodiments, the support element is at least 95% transparent. In certain embodiments, the support element is at least 99% transparent.

In certain embodiments, the support element is optically translucent.

In certain embodiments the support element can comprise a rigid material, e.g., glass, polycarbonate, acrylic, quartz, sapphire, or other known rigid materials.

In certain embodiments, the support element can comprise a flexible material, e.g., a polymeric material such as plastic (e.g. but not limited to thin acrylic, epoxy, polycarbonate, PEN, PET, PE) or a silicone.

In certain embodiments, the support element can comprise a flexible material including a silica or glass coating thereon. Preferably the silica or glass coating is sufficiently thin to retain the flexible nature of the base flexible material.

In certain embodiments, the support element has a transmission haze (as defined in ASTM D1003-0095) in a range from about 0.1% to about 5%. (ASTM D1003-0095 is hereby incorporated herein by reference.)

In certain embodiments, one or both of the major surfaces of the support element is smooth.

In certain embodiments, at least a portion of one or both major surfaces of the support element can be corrugated. In certain embodiments, one or both major surfaces of the support element can be corrugated.

In certain embodiments, at least a portion of one or both major surfaces of the support element can be roughened. In certain embodiments, one or both major surfaces of the support element can be roughened.

In certain embodiments, at least a portion of one or both major surfaces of the support element can be textured. In certain embodiments, one or both major surfaces of the support element can be textured.

In certain embodiments, one or both major surfaces of the support element can be concave.

In certain embodiments, one or both major surfaces of the support element can be convex.

In certain embodiments, at least a portion of one major surface of the support element can comprise microlenses. In certain embodiments, at least one major surface of the support element can comprise microlenses.

In certain embodiments, the thickness of the carrier substrate is substantially uniform.

In certain embodiments, the geometrical shape and dimensions of a support element can be selected based on the particular end-use application.

In certain embodiments, an optical component includes at least one layer including one or more optical materials comprising quantum confined semiconductor nanoparticles.

In certain embodiments including more than one type of quantum confined semiconductor nanoparticles, each type can be included in a separate layer.

In certain embodiments, the optical material is disposed across at least a portion of a surface of the support element.

In certain embodiments, the optical material is disposed across at least a portion of a major surface of the support element.

In certain embodiments, the optical material is disposed as an uninterrupted layer across a major surface of the support element.

In certain embodiments, a layer including optical material has a thickness, for example, from about 0.1 micron to about 1 cm. In certain embodiments, a layer of optical material can have a thickness from about 0.1 to about 200 microns. In certain embodiments, the thickness can be from about 10 to about 200 microns. In certain embodiments, the thickness can be from about 30 to about 80 microns.

In certain embodiments, other optional layers may also be included.

In certain embodiments, a layer can include two or more layers.

While further including a filter may be undesirable for energy considerations, there may be instances in which a filter is included for other reasons. In such instances, a filter may be included. In certain embodiments, a filter may cover all or at least a predetermined portion of the support element. In certain embodiments, a filter can be included for blocking the passage of one or more predetermined wavelengths of light. A filter layer can be included over or under the optical material. In certain embodiments, an optical component can include multiple filter layers on various surfaces of the support element. In certain embodiments, a notch filter layer can be included.

In certain embodiments, one or more anti-reflection coatings can be included in the optical component.

In certain embodiments, one or more wavelength selective reflective coatings can be included in the optical component. Such coatings can, for example, reflect light back toward the light source.

In certain embodiments, for example, an optical component may further include outcoupling members or structures across at least a portion of a surface thereof. In certain embodiments, outcoupling members or structures may be uniformly distributed across a surface. In certain embodiments, outcoupling members or structures may vary in shape, size, and/or frequency in order to achieve a more uniform light distribution outcoupled from the surface. In certain embodiments, outcoupling members or structures may be positive, e.g., sitting or projecting above the surface of optical component, or negative, e.g., depressions in the surface of the optical component, or a combination of both.

In certain embodiments, an optical component can further include a lens, prismatic surface, grating, etc. on the surface thereof from which light is emitted. Other coatings can also optionally be included on such surface.

In certain embodiments, outcoupling members or structures can be formed by molding, embossing, lamination, applying a curable formulation (formed, for example, by techniques including, but not limited to, spraying, lithography, printing (screen, inkjet, flexography, etc), etc.).

In certain embodiments, a support element can include light scatterers.

In certain embodiments, a support element can include air bubbles or air gaps.

In certain embodiments, an optical component can include one or more major, surfaces with a flat or matte finish.

In certain embodiments, an optical component can include one or more surfaces with a gloss finish.

In certain aspects and embodiments of the inventions taught herein, an optical component can optionally further include a cover, coating or layer for protection from the environment (e.g., dust, moisture, and the like) and/or scratching or abrasion.

In certain embodiments, the optical material is at least partially encapsulated.

In certain embodiments, the optical material is at least partially encapsulated by a barrier material. In certain embodiments, the optical material is at least partially encapsulated by a material that is substantially impervious to oxygen. In certain embodiments, the optical material is at least partially encapsulated by a material that is substantially impervious to moisture (e.g., water). In certain embodiments, the optical material is at least partially encapsulated by a material that is substantially impervious to oxygen and moisture. In certain embodiments, for example, the optical material can be sandwiched between substrates. In certain embodiments, one or both of the substrates can comprise glass plates. In certain embodiments, for example, the optical material can be sandwiched between a substrate (e.g., a glass plate) and a barrier film. In certain embodiments, the optical material can be sandwiched between two barrier films or coatings.

In certain embodiments, the optical material is fully encapsulated. In certain embodiments, for example, the optical material can be sandwiched between substrates (e.g., glass plates) that are sealed by a perimeter seal. In certain embodiments, for example, the optical material can be disposed on a substrate (e.g., a glass support) and fully covered by barrier film. In certain embodiments, for example, the optical material can be disposed on a substrate (e.g., a glass support) and fully covered by protective coating. In certain embodiments, the optical material can be sandwiched between two barrier films or coatings that are sealed by a perimeter seal.

Example of suitable barrier films or coatings include, without limitation, a hard metal oxide coating, a thin glass layer, and Barix coating materials available from Vitex Systems, Inc. Other barrier films or coating can be readily ascertained by one of ordinary skill in the art.

In certain embodiments, more than one barrier film or coating can be used to encapsulate the optical material.

Examples of light sources include, without limitation, solid state light emitting devices.

In certain embodiments, a light emitting device can include a single light source.

In certain embodiments, a light emitting device can include a plurality of light sources.

In certain embodiments including a plurality of light sources, the individual light sources can be the same or different.

In certain embodiments including a plurality of light sources, each individual light sources can emit light having a wavelength that is the same as or different from that emitted by each of the other light sources.

In certain embodiments including a plurality of light sources, the individual light sources can be arranged as an array.

In certain preferred embodiments, the off-white light emitting LED comprises a blue light emitting semiconductor LED including a phosphor material for converting the blue LED light output to off-white light.

In certain embodiments, for example, a blue light emitting LED component included in the off-white light emitting LED comprises e.g., (In)GaN blue.

In certain embodiments, a blue LED can emit light in a range from about 400 nm to about 500 nm.

In certain embodiments, a blue LED can emit light in a range from about 420 nm to about 475 nm.

In certain embodiments, a blue LED can emit light at a wavelength of about 470 nm.

In certain embodiments, the off-white light emitting LED comprises a UV light emitting semiconductor LED including a phosphor material for converting the UV LED light output to off-white light.

In certain embodiments, the weight ratio of quantum confined semiconductor nanoparticles to scatterers is from about 1:100 to about 100:1. In certain embodiments, the weight ratio of quantum confined semiconductor nanoparticles to scatterers is from about 1:2 to about 2:1.

As described herein, in certain embodiments of the present invention, a white-light emitting lighting device comprises one or more off-white light emitting light sources, and an optical component positioned to receive at least a portion of the light generated by the one or more light sources and convert at least a portion of the light so received to one or more predetermined wavelengths such that the light emitted by the lighting device includes light emission from the light source supplemented with light emission at one or more predetermined wavelengths to provide white light, wherein the optical component includes an optical material comprises quantum confined semiconductor nanoparticles.

Advantageously, in certain embodiments of the present invention including an optical component comprising red-emitting quantum confined semiconductor nanoparticles, the white light achieved can have a CRI of at least 75. In certain embodiments, the white light can have a CRI of at least 80. In certain embodiments, the white light can have a CRI of at least 85. In certain embodiments, the white light can have a CRI of at least 90. In certain embodiments, the white light can have a CRI of at least 95.

In certain preferred embodiments, the white light output can have an R9 value that is a positive number. More preferably, the R9 value is at least 50. Most preferably, the R9 value is greater than 80.

In certain embodiments, the white light can have a predetermined CRI. In certain embodiments, the predetermined CRI is at least 75. In certain embodiments, the predetermined CRI is at least 80. In certain embodiments, the predetermined CRI is at least 85. In certain embodiments, the predetermined CRI is at least 90. In certain embodiments, the predetermined CRI is at least 95.

In certain embodiments, the optical material is not in direct contact with the light source. In certain embodiments, the optical component is not in direct contact with the light source. Preferably the temperature at the location of the nanoparticles during operation of the lighting device is less than 100° C., less than 90° C., less than 75° C., 60° C. or less, 50° C. or less, 40° C. or less. In certain preferred embodiments, the temperature at the location of the nanoparticles during operation of the lighting device is in a range from about 30° C. to about 60° C.

In certain embodiments, the light source comprises an off-white LED (e.g., a blue emitting semiconductor LED that is encapsulated with an encapsulant including phosphor material), and the optical component comprises an optical material comprising quantum confined semiconductor nanoparticles capable of emitting red light.

In certain embodiments of a lighting device in accordance with the invention that include, e.g., one or more light sources comprising one or more off-white light emitting LEDs and an optical component comprising an optical material comprising quantum confined semiconductor nanoparticles that can emit light in the orange to red spectral region, an emission in the orange to red spectral region is added to the light output of the lighting device.

In certain embodiments, the addition of the nanoparticles with a predetermined emission wavelength in the spectral range from about 575 nm to about 650 nm can improve the lumens per watt efficiency of white light emitted from the lighting device without increasing the power requirements thereof.

In certain embodiments, compensation of one or more spectral deficiencies of the light source by the optical component can alter the light output from the light source to achieve white light with a correlated color temperature (CCT). In certain embodiments, the white light can have a predetermined CCT. In certain embodiments, the white light output of the white-light emitting lighting device can have a CCT of at least about 2000K. In certain embodiments, the white light output of the white-light emitting lighting device can have a CCT of at least about 2500K. In certain embodiments, the white light output of the white-light emitting lighting device can have a CCT of at least about 3000K. In certain embodiments, the white light output of the white-light emitting lighting device can have a CCT of at least about 4000K. In certain embodiments, the white light output of the white-light emitting lighting device can have a CCT of at least about 5000K.

General Color Rendering Index (which can be abbreviated as $R_a$), as used herein refers to the common definition of color rendering index as a mean value for 8 standard color samples ($R_{1-8}$). R9 as used herein refers to the ninth standard color sample (strong red) as referenced by the International Commission on Illumination (CIE).

In certain embodiments of a lighting device in accordance with the invention that include, e.g., a light source comprising an off-white light emitting LED and an optical component comprising an optical material comprising orange (e.g., about 575 nm to about 595 nm) emitting quantum confined semiconductor nanoparticles, an orange emission component is added to the light output of the lighting device.

In certain embodiments, the addition of the nanoparticles with a predetermined emission wavelength in the orange spectral region can improve the lumens per watt efficiency of white light emitted from the lighting device without increasing the power requirements thereof.

In certain embodiments of a lighting device in accordance with the invention that include, e.g., a light source comprising an off-white light emitting LED and an optical component comprising an optical material comprising cyan emitting quantum confined semiconductor nanoparticles, a cyan emission component is added to the light output of the lighting device.

In certain embodiments, the addition of the nanoparticles with a predetermined emission wavelength in the cyan spectral region can improve the lumens per watt efficiency of white light emitted from the lighting device without increasing the power requirements thereof as well as the CRI.

In certain embodiments, a light source comprises one or more light sources.

In certain embodiments, a light source comprises one or more solid state semiconductor light emitting diodes.

In accordance with another aspect of the present invention, there is provided an optical component for creating white light with a predetermined CRI from a light source that emits off-white light, wherein the off-white light includes a spectral output including at least one spectral component in a first spectral region from about 360 nm to about 475 nm, at least one spectral component in a second spectral region from about 475 nm to about 575 nm, and a deficiency in at least one other spectral region, the optical component comprising an optical material for converting at least a portion of the light output from the off-white light source to one or more different predetermined wavelengths such that light emanating from the optical component comprises white light, wherein the optical material comprises quantum confined semiconductor nanoparticles.

In certain embodiments, the off-white light includes a blue spectral component and a green and/or yellow spectral component and further includes at least one spectral deficiency in another region of the spectrum.

In certain embodiments, a light source comprises one or more light sources.

In certain embodiments, a light source comprises one or more solid state semiconductor light emitting diodes.

In certain embodiments, the white light has a predetermined CRI. In certain embodiments, the predetermined CRI is at least 75. In certain embodiments, the predetermined CRI is at least 80. In certain embodiments, the predetermined CRI is at least 85. In certain embodiments, the predetermined CRI is at least 90. In certain embodiments, the predetermined CRI is at least 95.

In certain preferred embodiments, a predetermined wavelength is selected to meet or compensate for a deficiency in the spectral region of the light source, for example, by supplementing the light output of the light source in at least one of the spectral deficiency regions.

In certain embodiments, for example, where a light source emits off-white light with a spectral deficiency in the orange to red spectral region, the predetermined wavelength can be in a range from about 575 nm to about 650 nm, from about 580 nm to 630 nm, from about 590 nm to about 630 nm, from about 605 nm to 620 nm, etc.

In certain embodiments, for example, where a light source emits off-white light with a spectral deficiency in the cyan spectral region, the optical material can comprise one or more different types of quantum confined semiconductor nanoparticles that can emit at one or more predetermined wavelengths in a range from about 450 nm to about 500 nm.

In certain embodiments, the optical component includes an optical material comprising one or more different types of quantum confined semiconductor nanoparticles (based on composition, structure and/or size), wherein each different type of quantum confined semiconductor nanoparticles emits light at predetermined wavelength that is different from the predetermined wavelength emitted by any other type of quantum confined semiconductor nanoparticles included in the optical material, and wherein one or more different predetermined wavelengths are selected such that the optical material will compensate for one or more spectral deficiencies of the intended off-white light source(s).

In certain embodiments including one or more different types of quantum confined semiconductor nanoparticles that emit at different predetermined wavelengths, the different types of quantum confined semiconductor nanoparticles can be included in one or more different optical materials.

In certain embodiments including two or more different types of quantum confined semiconductor nanoparticles that emit at different predetermined wavelengths, the different types of quantum confined semiconductor nanoparticles can be included in two or more different optical materials.

In certain embodiments including two or more different optical materials, such different optical materials can, for example, be included as separate layers of a layered arrangement and/or as separate features of a patterned layer.

In certain embodiments wherein the off-white light source has more than one spectral deficiency, the desired white light output can be achieved by addressing a spectral deficiency in at least the red spectral region.

In certain embodiments, compensation of one or more spectral deficiencies of the light source by the optical component can alter the light output from the light source to achieve white light with a General Color Rendering Index ($R_a$). In certain embodiments, the CRI is at least 75. In certain embodiments, the CRI is at least 80. In certain embodiments, the CRI is at least 85. In certain embodiments, the CRI is at least 90. In certain embodiments, the CRI is at least 95.

In certain preferred embodiments, the white light output can have an R9 value that is a positive number. More preferably, the R9 value is at least 50. Most preferably, the R9 value is greater than 80.

In certain embodiments, the white light emitted by the white-light emitting device can have a predetermined CRI. In certain embodiments, the predetermined CRI is at least 75. In certain embodiments, the predetermined CRI is at least 80. In certain embodiments, the predetermined CRI is at least 85. In certain embodiments, the predetermined CRI is at least 90. In certain embodiments, the predetermined CRI is at least 95.

In certain embodiments, compensation of one or more spectral deficiencies of the light source by the optical component can alter the off-white light output from the light source to achieve white light with a correlated color temperature (CCT). In certain embodiments, the white light can have a predetermined CCT. In certain embodiments, the white light output of the white-light emitting lighting device can have a CCT of at least about 2000K. In certain embodiments, the white light output of the white-light emitting lighting device can have a CCT of at least about 2500K. In certain embodiments, the white light output of the white-light emitting lighting device can have a CCT of at least about 3000K. In certain embodiments, the white light output of the white-light emitting lighting device can have a CCT of at least about 4000K. In certain embodiments, the white light output of the white-light emitting lighting device can have a CCT of at least about 5000K.

In certain embodiments, the lumens per watt efficiency of white light created from the off-white light source(s) is not substantially affected by alteration of the CCT within the range from about 2500K to about 3500K through use of the optical component. For example, the lumens per watt efficiency does not vary by more than 10 percentage points (as opposed to 10% of the initial lumens per watt efficiency value) as CCT is altered within the range from about 2500K to about 3500K.

In certain preferred embodiments, quantum confined semiconductor nanoparticles comprise semiconductor nanocrystals.

In certain embodiments, the quantum confined semiconductor nanoparticles have a solid state quantum efficiency of at least 40%. In certain embodiments, the quantum confined semiconductor nanoparticles have a solid state quantum efficiency of at least 50%. In certain embodiments, the quantum confined semiconductor nanoparticles have a solid state quantum efficiency of at least 60%. In certain embodiments, the quantum confined semiconductor nanoparticles have a solid state quantum efficiency of at least 70%. In certain embodiments, the quantum confined semiconductor nanoparticles have a solid state quantum efficiency of at least 80%. In certain embodiments, the quantum confined semiconductor nanoparticles have a solid state quantum efficiency of at least 90%.

In certain embodiments, the quantum confined semiconductor nanoparticles maintain at least 40% efficiency during use of the optical component.

In certain embodiments, the optical material comprises quantum confined semiconductor nanoparticles capable of emitting red light. In certain embodiments, the optical material comprises quantum confined semiconductor nanoparticles capable of emitting light in the orange to red spectral region.

In certain embodiments, the optical material further comprises a host material in which the quantum confined semiconductor nanoparticles are distributed. In certain embodiments, quantum confined semiconductor nanoparticles are included in the optical material in an amount in a range from about 0.001 to about 5 weight percent of the weight of the host material. In certain embodiments, quantum confined semiconductor nanoparticles are included in the optical material in an amount in a range from about 0.5 to about 3 weight percent of the weight of the host material. In certain embodiments, quantum confined semiconductor nanoparticles are included in the optical material in an amount in a range from about 1 to about 3 weight percent of the weight of the host material. In certain embodiments, quantum confined semiconductor nanoparticles are included in the optical material in an amount in a range from about 1 to about 2 weight percent of the weight of the host material.

In certain embodiments of an optical material further including a host material, quantum confined semiconductor nanoparticles can be included in an optical material in an amount greater than about 5 weight percent of the host material. For example, the optical material can include from about 5 to about 20 weight percent quantum confined semiconductor nanoparticles based on the weight of the host material; the optical material can include from about 5 to about 15 weight percent quantum confined semiconductor nanoparticles based on the weight of the host material, the optical material can include from about 5 to about 10 weight percent quantum confined semiconductor nanoparticles based on the weight of the host material, etc.

Other concentrations of quantum confined semiconductor nanoparticles in an optical material outside of the above ranges may also be determined to be useful or desirable.

In certain embodiments, the optical material further comprises light scatterers.

In certain embodiments, the light scatterers comprise light scattering particles.

In certain embodiments, light scattering particles are included in the optical material in an amount in a range from about 0.001 to about 5 weight percent of the weight of the host material. In certain embodiments, light scattering particles are included in the optical material in an amount in a range from about 0.25 to about 4 weight percent of the weight of the host material. In certain embodiments, light scattering particles are included in the optical material in an amount in a range from about 0.5 to about 3 weight percent of the weight of the host material. In certain embodiments, light scattering particles are included in the optical material in an amount in a range from about 0.5 to about 2 weight percent of the weight of the host material. In certain embodiments, light scattering particles are included in the optical material in an amount in a range from about 1 to about 2 weight percent of the weight of the host material.

In certain embodiments, light scattering particles are included in the optical material in an amount greater than about 5 weight percent of the host material. For example, the optical material can include from about 5 to about 20 weight percent light scattering particles based on the weight of the host material; the optical material can include from about 5 to about 15 weight percent light scattering particles based on the weight of the host material, the optical material can include from about 5 to about 10 weight percent light scattering particles based on the weight of the host material, etc.

Other concentrations of light scattering particles in an optical material outside of the above ranges may also be determined to be useful or desirable.

In certain embodiments, an optical component further includes a support element. Preferably, the support element is optically transparent to light emitted from the light source and to light emitted from the nanoparticles.

In certain embodiments, an optical component including a support element can serve as a cover plate for a lighting device.

In certain embodiments, the support element comprises a light diffuser component of a lighting device.

In certain embodiments, the support element is rigid.

In certain embodiments, the support element is flexible.

In certain embodiments, the geometrical shape and dimensions of a support element can be selected based on the particular end-use application (e.g., lamp, lighting device, lighting fixture, or other apparatus or device).

In certain embodiments, the optical material comprising quantum confined semiconductor nanoparticles is disposed over at least a portion of a surface of a support element. In certain embodiments, the optical material comprising quantum confined semiconductor nanoparticles is disposed over at least a portion of a major surface of a support element. In certain embodiments, the optical material is disposed between the support element and a protective coating or cover that is optically transparent to light emitted by the light source and optical material.

In certain embodiments, the optical material is disposed as one or more layers over a predetermined area of the surface of the support element.

In certain embodiments, the layer comprises an optical material that further includes a host material in which the quantum confined semiconductor nanoparticles are distributed. In certain embodiments, the layer includes from about 0.001 to about 5 weight percent quantum confined semiconductor nanoparticles based on the weight of the host material.

In certain embodiments the layer includes greater than about 5 weight percent quantum confined semiconductor nanoparticles based on the weight of the host material. For example, the layer can include from about 5 to about 20 weight percent quantum confined semiconductor nanoparticles based on the weight of the host material; from about 5 to about 15 weight percent quantum confined semiconductor nanoparticles based on the weight of the host material, from about 5 to about 10 weight percent quantum confined semiconductor nanoparticles based on the weight of the host material, etc.

Other concentrations of quantum confined semiconductor nanoparticles in the layer outside of the above ranges may also be determined to be useful or desirable.

In certain embodiments, the layer further comprises light scatterers.

In certain embodiments, light scatterers are included in the layer in an amount in the range from about 0.001 to about 5 weight percent of the weight of the host material.

In certain embodiments the layer includes greater than about 5 weight percent light scattering particles based on the weight of the host material. For example, the layer can include from about 5 to about 20 weight percent light scattering particles based on the weight of the host material; from about 5 to about 15 weight percent light scattering particles based on the weight of the host material, from about 5 to about 10 weight percent light scattering particles based on the weight of the host material, etc.

Other concentrations of light scattering particles in the layer outside of the above ranges may also be determined to be useful or desirable.

In certain embodiments, a layer including optical material including a host material has a thickness, for example, from about 0.1 micron to about 1 cm. In certain embodiments, a layer including optical material including a host material has a thickness from about 0.1 to about 200 microns. In certain embodiments, a layer including optical material including a host material has a thickness from about 10 to about 200 microns. In certain embodiments, a layer including optical material including a host material has a thickness from about 30 to about 80 microns.

In certain embodiments, the off-white light includes a blue spectral component and a green and/or yellow spectral component and further includes at least one spectral deficiency in another region of the spectrum.

In certain of such embodiments, the optical component can convert at least 10% of the emission in the blue spectral region to one or more predetermined wavelengths.

In certain of such embodiments, the optical component can convert at least 30% of the emission in the blue spectral region to one or more predetermined wavelengths.

In certain of such embodiments, the optical component can convert at least 60% of the emission in the blue spectral region to one or more predetermined wavelengths.

In certain of such embodiments, no more than 95% of the emission in the blue spectral region is converted by the quantum confined semiconductor nanoparticles.

In certain of such embodiments, no more than 90% of the emission in the blue spectral region is converted by the quantum confined semiconductor nanoparticles.

In certain of such embodiments, the optical component can convert from about 50% to about 80% of the emission in the blue spectral region to one or more predetermined wavelengths.

In certain of such embodiments, the optical component can convert from about 60% to about 80% of the emission in the blue spectral region to one or more predetermined wavelengths.

In certain embodiments, quantum confined semiconductor nanoparticles included in an optical material are cadmium free.

In certain embodiments, quantum confined semiconductor nanoparticles included in an optical material comprise a III-V semiconductor material.

In certain embodiments, quantum confined semiconductor nanoparticles included in an optical material comprise a semiconductor nanocrystal including a core comprising a semiconductor material and an inorganic shell disposed on at least a portion of a surface of the core.

In certain embodiments, the optical material is at least partially encapsulated.

In certain embodiments, the optical material is fully encapsulated.

In accordance with another aspect of the present invention, there is provided a lighting fixture adapted to receive one or more light sources, wherein the fixture includes an optical component that is positioned in the fixture relative to the position of the one or more light sources such that at least a portion of the light generated by the one or more light sources passes into the optical component before light output is emitted from the fixture, wherein the optical component comprises an optical component taught herein.

In certain embodiments, the lighting fixture includes a housing adapted to receive one or more light sources, wherein the optical component is positioned in the fixture relative to the position of the one or more light sources to receive at least a portion, and preferably all, of the light emitted by the one or more light sources.

In certain embodiments, a light source comprises an off-white light emitting LED. In certain of such embodiments, the light output from the lighting fixture is white light with a CRI. In certain embodiments, the CRI is at least 75. In certain embodiments, the CRI is at least 80. In certain embodiments, the CRI is at least 85. In certain embodiments, the CRI is at least 90. In certain embodiments, the CRI is at least 95.

In certain preferred embodiments, the white light output can have an R9 value that is a positive number. More preferably, the R9 value is at least 50. Most preferably, the R9 value is greater than 80.

In certain embodiments, the white light emitted by the white-light emitting device can have a predetermined CRI. In certain embodiments, the predetermined CRI is at least 75. In certain embodiments, the predetermined CRI is at least 80. In certain embodiments, the predetermined CRI is at least 85. In certain embodiments, the predetermined CRI is at least 90. In certain embodiments, the predetermined CRI is at least 95.

In certain of embodiments, the light output from the lighting fixture is white light with a predetermined CCT. In certain embodiments, the CCT is at least 2000K. In certain embodiments, the predetermined CCT is at least 2500K. In certain embodiments, the predetermined CCT is at least 3000K. In certain embodiments, the predetermined CCT is at least 4000K. In certain embodiments, the predetermined CCT is at least 5000K. In accordance with a further aspect of the present invention, there is provided a cover plate for use with lighting fixture for use with one or more light sources, the cover plate being adapted for attachment to the lighting fixture to receive at least portion of the light emitted from the one or more light sources, the cover plate comprising an optical component described herein.

In accordance with a further aspect of the present invention, there is provided a cover plate adapted for attachment to a lighting device including one or more solid state semiconductor light emitting devices, the cover plate comprising an optical component described herein.

The cover plate is preferably adapted for attachment to the device so as to receive at least portion of the light emitted from the one or more light emitting devices.

In certain embodiments, a lighting device comprises a lamp.

In accordance with yet a further aspect of the present invention, there is provided a method for creating white light with a predetermined CRI from an off-white light source, the method comprising passing at least a portion of the off-white light emitted by the light source, wherein the off-white light includes a spectral output including at least one spectral component in a first spectral region from about 360 nm to about 475 nm, at least one spectral component in a second spectral region from about 475 nm to about 575 nm, and at least one deficiency in at least one other spectral region into an optical material to convert at least a portion of the off-white light into one or more emissions in a range from about 575 to about 650 nm to obtain white light with the predetermined CRI, the optical material comprising quantum confined semiconductor nanoparticles.

In certain embodiments, an off-white light source comprises one or more light sources.

In certain embodiments, an off-white light source comprises one or more solid state semiconductor light emitting diodes.

In certain embodiments, the predetermined CRI is at least 75. In certain embodiments, the predetermined CRI is at least 80. In certain embodiments, the predetermined CRI is at least 85. In certain embodiments, the predetermined CRI is at least 90. In certain embodiments, the predetermined CRI is at least 95. Preferably the optical material spaced from, and not on a surface of the light emitting device.

In certain of embodiments, the light output from the lighting fixture is white light with a predetermined CCT. In certain embodiments, the CCT is at least 2000K. In certain embodiments, the predetermined CCT is at least 2500K. In certain embodiments, the predetermined CCT is at least 3000K. In certain embodiments, the predetermined CCT is at least 4000K. In certain embodiments, the predetermined CCT is at least 5000K.

In certain embodiments, for example, the optical material can convert at least a portion of the blue spectral emission into one or more emissions in a range from about 580 nm to about 630 nm, from about 590 nm to about 630 nm, from about 600 nm to about 620 nm, from about 605 nm to about 615 nm, etc.

In certain embodiments, one or more different types of quantum confined semiconductor nanoparticles that emit at different predetermined wavelengths can be included in one or more different optical materials.

In certain embodiments including two or more different types of quantum confined semiconductor nanoparticles that emit at different predetermined wavelengths, the different types of quantum confined semiconductor nanoparticles can be included in two or more different optical materials.

In certain embodiments, the method includes an optical material taught herein.

In certain embodiments, the method includes an optical component taught herein.

In certain embodiments, including two or more different optical materials, such different optical materials can, for example, be included as separate layers of a layered arrangement and/or as separate features of a patterned layer.

In accordance with yet a further aspect of the present invention, there is provided a method for improving the lumens per watt efficiency of white light created from an off-white light emitting solid state semiconductor light emitting device having a spectral output including emissions in the blue spectral region and green and/or yellow spectral regions, the method comprising passing at least a portion of the blue emission into an optical material to convert at least a portion of the blue spectral emission to emission in a range from about 575 nm to about 650 nm, the optical material comprising quantum confined semiconductor nanoparticles.

In certain embodiments, the method includes an optical material taught herein.

In certain embodiments, the method includes an optical component taught herein.

In certain embodiments, a light source comprises one or more light sources.

In certain embodiments, a light source comprises one or more solid state semiconductor light emitting diodes.

In certain embodiments, for example, the optical material can convert at least a portion of the blue spectral emission to emission in a range from about 580 nm to about 630 nm, from about 590 nm to about 630 nm, from about 605 nm to about 620 nm, etc.

In certain embodiments including two or more different types of quantum confined semiconductor nanoparticles that emit at different predetermined wavelengths, the different types of quantum confined semiconductor nanoparticles can be included in one or more different optical materials.

In certain embodiments including two or more different types of quantum confined semiconductor nanoparticles that emit at different predetermined wavelengths, the different types of quantum confined semiconductor nanoparticles can be included in two or more different optical materials.

In certain aspects and embodiments of the inventions taught herein, the optical material (e.g., comprising quantum confined semiconductor nanoparticles dispersed in a host material (preferably a polymer or glass)) is exposed to light flux for a period of time sufficient to increase the photoluminescent efficiency of the optical material. In certain embodiments, the optical material is exposed to light and heat for a period of time sufficient to increase the photoluminescent efficiency of the optical material. In certain embodiments, the exposure to light or light and heat is continued for a period of time until the photoluminescent efficiency reaches a substantially constant value. In certain embodiments, an LED light source with peak wavelength of about 450 nm is used as the source of light flux. Other known light sources can be readily identified by the skilled artisan. In certain embodiments, the light flux is from about 10 to about 100 mW/cm$^2$, preferably from about 20 to about 35 mW/cm$^2$, and more preferably from about 20 to about 30 mW/cm$^2$. In embodiments that include exposing the optical material to light and heat, the optical material is exposed to light while at a temperature in a range from about 25° to about 80° C. In certain embodiments, the optical material (e.g., comprising quantum confined semiconductor nanoparticles dispersed in a host material (preferably a polymer or glass)) can be encapsulated (for example, a layer of optical material can be disposed between glass plates, barrier films, or combinations thereof) when exposed to light, whether or not heat is also applied. In certain examples, the glass plates, barrier films, or combination thereof can further be sealed together around the perimeter or edge. In certain embodiments, the seal comprises barrier material. In certain embodiments, the seal comprises an oxygen barrier. In certain embodiments, the seal comprises a water barrier. In certain embodiments, the seal comprises an oxygen and water barrier. In certain embodiments, the seal is substantially impervious to water and/or oxygen. Examples of sealing techniques include, but are not limited to, glass-to-glass seal, glass-to-metal seal, sealing materials that are substantially impervious to oxygen and/or water, epoxies and other sealing materials that slow down penetration of oxygen and/or moisture. In certain embodiments, the optical material (e.g., comprising quantum confined semiconductor nanoparticles dispersed in a host material (preferably a polymer or glass)) can be partially encapsulated when exposed to light, whether or not heat is also applied.

In certain embodiments and aspects of the inventions described herein, the geometrical shape and dimensions of a support element, an optical component, a base plate, and/or cover plate can be selected based on the particular end-use application.

In certain embodiments, the optical material is at least partially encapsulated.

In certain embodiments, the optical material is fully encapsulated.

Figure 3:
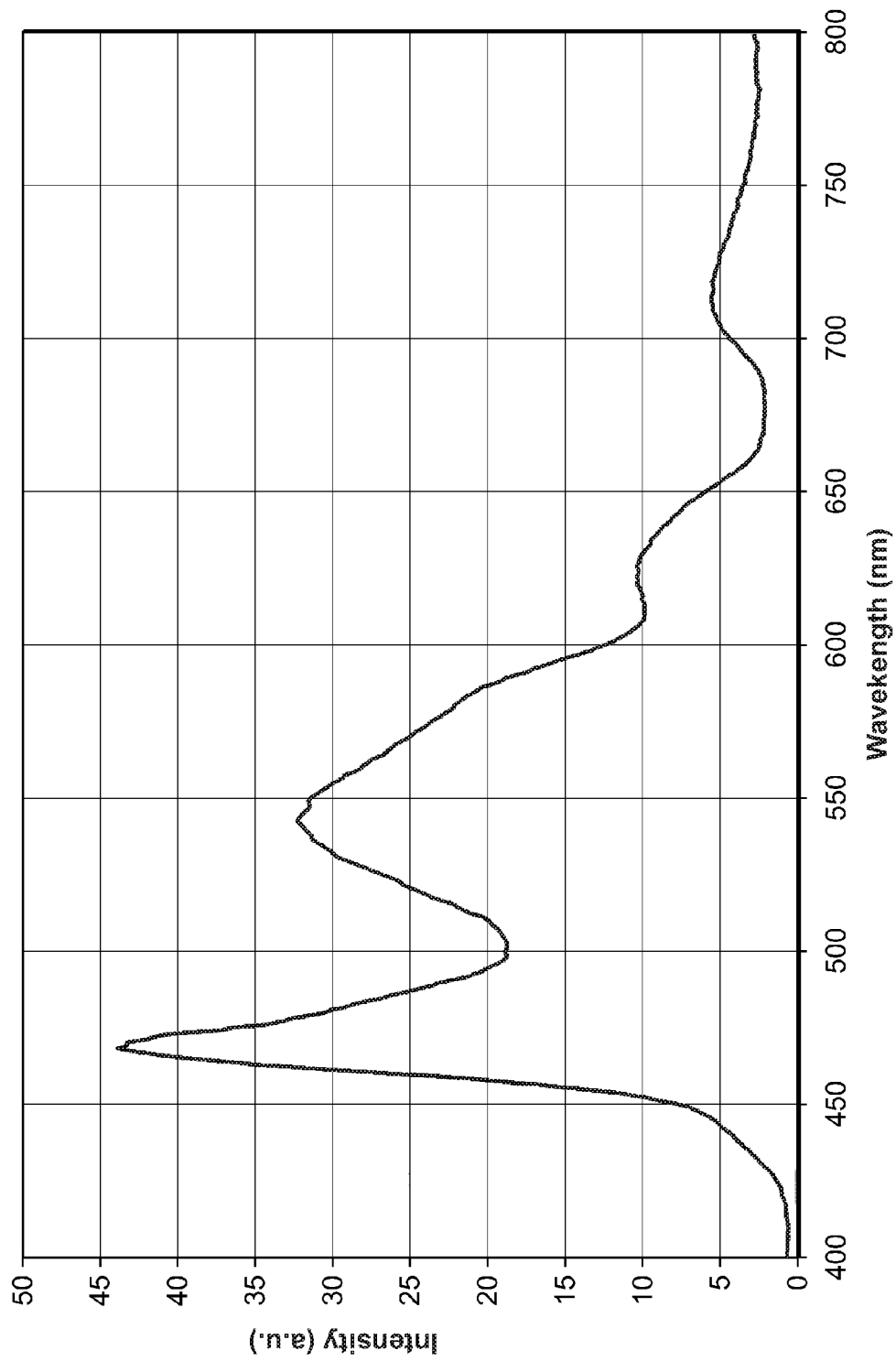
FIG. 3 depicts an example of a spectrum of an off-white light source.

In certain embodiments, an off-white light emitting light source has a spectral output substantially similar to that depicted in FIG. 3.

Advantageously, use of an off-white LED with a spectral output that is the same as, or substantially similar to, that depicted in FIG. 3 (e.g., but not limited to, CL-191G. available from Citizen Electronics Co., Ltd. (which utilizes a 470 nm chip and a luminescent material)) and an optical material comprising red-emitting quantum confined semiconductor nanoparticles can provide a white light emission with the additional benefit of a Color Rendition Index greater than 90. (See Example 2 below for a non-limiting illustrative example.)

Photoluminescent efficiency can be measured, for example, with use of a spectrophotometer in an integrating sphere including a NIST traceable calibrated light source. In such embodiments, the optical material can further include light scattering particles and other optional additives described herein.

The present invention will be further clarified by the following examples, which are intended to be exemplary of the present invention.

EXAMPLES

Example 1

Example 1A

Preparation of Semiconductor Nanocrystals Capable of Emitting 609 nm Light with 3,5-di-tert-butyl-4-hydroxybenzylphosphonic acid Synthesis of CdSe Cores:

1.75 mmol cadmium acetate is dissolved in 15.7 mmol of tri-n-octylphosphine at 140° C. in a 20 mL vial and then dried and degassed for one hour. 31.0 mmol of trioctylphosphine oxide and 4 mmol of octadecylphosphonic acid are added to a 3-neck flask and dried and degassed at 110° C. for one hour. After degassing, the Cd solution is added to the oxide/acid flask and the mixture is heated to 270° C. under nitrogen. Once the temperature reaches 270° C., 16 mmol of tri-n-butylphosphine is injected into the flask. The temperature is brought back to 270° C. where 2.3 mL of 1.5 M TBP-Se is then rapidly injected. The reaction mixture is heated at 270° C. for 5 minutes and then the heating mantle is removed from the reaction flask allowing the solution to cool to room temperature. The CdSe cores are precipitated out of the growth solution inside a nitrogen atmosphere glovebox by adding a 3:1 mixture of methanol and isopropanol. The isolated cores are then dissolved in hexane and used to make core-shell materials. (Abs/Emission/FWHM (nm)=557/566/27).

Synthesis of CdSe/CdZnS Core-Shell Nanocrystals:

Two identical reactions are set up whereby 25.86 mmol of trioctylphosphine oxide and 2.4 mmol of 3,5-di-tert-butyl-4-hydroxybenzylphosphonic acid (see * below) are loaded into 50 mL four-neck round bottom flasks. The mixtures are then dried and degassed in the reaction vessels by heating to 120° C. for about an hour. The flasks are then cooled to 70° C. and the hexane solution containing isolated CdSe cores from above (0.128 mmol Cd content) are added to the respective reaction mixture. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S is in two-fold excess relative to the Cd and Zn. Two sets of Cd/Zn (0.35 mmol of dimethylcadmium and diethylzinc) and S (1.40 mmol of hexamethyldisilathiane) samples are each dissolved in 4 mL of trioctylphosphine inside a nitrogen atmosphere glove box. Once the precursor solutions are prepared, the reaction flasks are heated to 155° C. under nitrogen. The Cd/Zn and S precursor solutions are added dropwise to the respective reaction flasks over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The isolated core-shell nanocrystals are then dispersed in toluene and the solutions from the two batches are combined and used to make optical materials including same (Abs/Emission/FWHM (nm)=597/609/31).

*Preparation of 3,5-Di-tert-butyl-4-hydroxybenzylphosphonic acid 3,5-Di-tert-butyl-4-hydroxybenzylphosphonic acid is obtained from PCI Synthesis, 9 Opportunity Way, Newburyport, Mass. 01950.

The preparation of 3,5-Di-tert-butyl-4-hydroxybenzylphosphonic acid generally utilizes the following synthetic approach:

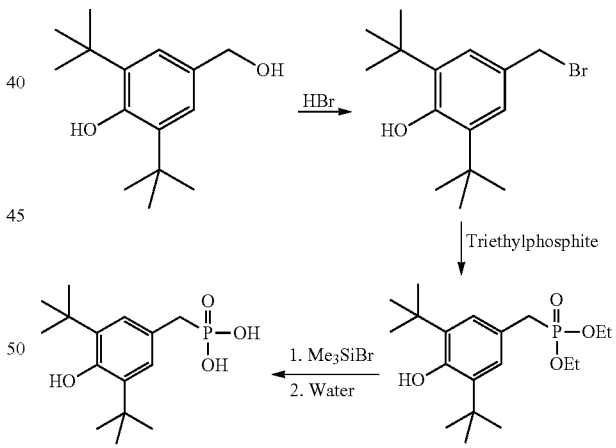

3,5-Di-tert-butyl-4-hydroxybenzylphosphonic acid can be characterized by the following::

Melting point: 199-200° C. [Lit: 200° C.; Literature ref: J. D. Spivack, FR1555941 (1969)] IR: 3614 cm$^{-1}$, 3593 cm$^{-1}$ (weak, O—H stretching).

$^{1}$H-NMR (CD$_3$OD): δ 7.10 (d, aromatic, 2H, J$_{P\text{-}H}$=2.6 Hz), 5.01 (s, exchanged HOD), 2.99 (d, —CH$_2$, 2H, J$_{P\text{-}H}$=21.2 Hz), 1.41 (s, —CH$_3$, 18H).

$^{13}$C-NMR (CD$_3$OD): δ 152.9 (aromatic), 137.9 (aromatic), 126.2 (aromatic), 123.5 (aromatic), 34.41 (d, —CH$_2$, 35.75, 33.07, J$_{P\text{-}C}$=537.2 Hz), 34.35 (—C(CH$_3$)$_3$), 29.7 (—C(CH$_3$)$_3$)

$^{31}$P-NMR (CD$_3$OD): δ 26.8

The above-identified synthetic precursors included in the preparation of 3,5-Di-tert-butyl-4-hydroxybenzylphosphonic acid can be characterized by the following:

Diethyl
3,5-di-tert-butyl-4-hydroxybenzylphosphonate

Melting point: 119-120° C. (Lit: 118-119° C.; Literature ref: R. K. Ismagilov, *Zhur. Obshchei Khimii,* 1991, 61, 387).
IR: 3451 cm$^{-1}$ (weak, —OH, stretching), 2953 (weak, —CH$_3$, C—H stretching).
$^1$H-NMR (CDCl$_3$): δ 7.066 (d, Ar—H, 2H, J$_{P-H}$=2.8 Hz), 5.145 (s, 1H, —OH), 4.06-3.92 (m, —CH$_2$CH$_3$, 4H, H—H and long-range P—H couplings), 3.057 (d, Ar—CH$_2$, 2H, J$_{P-H}$=21.0 Hz), 1.412 (s, —C(CH$_3$)$_3$, 18H), 1.222 (t, —CH$_2$CH$_3$, 6H).
$^{13}$C-NMR (CDCl$_3$): δ 153.98 (aromatic), 136.22 (aromatic), 126.61 (aromatic), 122.07 (aromatic), 62.14 (—OCH$_2$CH$_3$, J$_{P-C}$=24.4 Hz), 33.63 (Ar—CH$_2$, J$_{P-C}$=552.4 Hz), 34.53 [—C(CH$_3$)$_3$], 30.54 [—C(CH$_3$)$_3$], 16.66 (—CH$_2$CH$_3$, J$_{P-C}$=24.4 Hz).
$^{31}$P-NMR (CDCl$_3$): δ 28.43.

3,5-di-tert-butyl-4-hydroxybenzyl bromide

Melting point: 51-54° C. (Lit: 52-54° C.; Literature ref: J. D. McClure, *J. Org. Chem.,* 1962, 27, 2365)
IR: 3616 cm$^{-1}$ (medium, O—H stretching), 2954 cm$^{-1}$ (weak, alkyl C—H stretching).
$^1$H-NMR (CDCl$_3$): δ 7.20 (s, Ar—H, 2H), 5.31 (s, —OH), 4.51 (s, —CH$_2$, 2H), 1.44 { s, [—C(CH$_3$)$_3$], 18H}.
$^{13}$C-NMR (CDCl$_3$): δ 154.3 (aromatic), 136.5 (aromatic), 128.7 (aromatic), 126.3 (aromatic), 35.8 [(—C(CH$_3$)$_3$], 34.6 (—CH$_2$), 30.5 [—C(CH$_3$)$_3$].

Other synthetic approaches that are known or readily ascertainable by one of ordinary skill in the relevant art can be used to prepare 3,5-Di-tert-butyl-4-hydroxybenzylphosphonic acid.

Example 1B

Preparation of Semiconductor Nanocrystals Capable of Emitting Green Light

Synthesis of ZnSe Cores:
3.5 mmol diethyl zinc is dissolved in 25 mL of tri-n-octylphosphine and mixed with 5 mL of 1 M TBP-Se. 0.16 mol of Oleylamine is loaded into a 250 mL 3-neck flask, dried and degassed at 90° C. for one hour. After degassing, the flask is heated to 310° C. under nitrogen. Once the temperature reaches 310° C., the Zn solution is injected and the reaction mixture is heated at 270° C. for 15-30 minutes while aliquots of the solution are removed periodically in order to monitor the growth of the nanocrystals. Once the first absorption peak of the nanocrystals reaches 350 nm, the reaction is stopped by dropping the flask temperature to 160° C. and the ZnSe core materials are used without further purification for preparation of CdZnSe cores.

Synthesis of CdZnSe Cores:
11.2 mmol dimethylcadmium is dissolved in 40 mL of tri-n-octylphosphine and mixed with 12 mL of 1 M TBP-Se. In a 1 L glass reactor, 0.414 mol of trioctylphosphine oxide and 40 mmol of hexylphosphonic acid are loaded, dried and degassed at 120° C. for one hour. After degassing, the oxide/acid is heated to 160° C. under nitrogen and the entire ZnSe core reaction mixture (see above) is cannula transferred at 160° C. into the 1 L reactor, immediately followed by the addition of Cd/Se solution over the course of 20 minutes via syringe pump. The reaction mixture is then heated at 150° C. for 16-20 hours while aliquots of the solution are removed periodically in order to monitor the growth of the nanocrystals. The reaction is stopped by cooling the mixture to room temperature once the emission peak of the CdZnSe cores reaches 489 nm. The CdZnSe cores are precipitated out of the growth solution inside a nitrogen atmosphere glove box by adding a 2:1 mixture of methanol and n-butanol. The isolated cores are then dissolved in hexane and used to make core-shell materials.

Synthesis of CdZnSe/CdZnS Core-Shell Nanocrystals:
0.517 mol of trioctylphosphine oxide and 44.8 mmol of benzylphosphonic acid are loaded into a 1 L glass reactor. The mixture is then dried and degassed in the reactor by heating to 120° C. for about an hour. The reactor is then cooled to 75° C. and the hexane solution containing isolated CdZnSe cores (1.99 mmol Cd content) is added to the reaction mixture. The hexane is removed under reduced pressure. Dimethyl cadmium, diethyl zinc, and hexamethyldisilathiane are used as the Cd, Zn, and S precursors, respectively. The Cd and Zn are mixed in a 3:10 ratio while the S was in two-fold excess relative to the Cd and Zn (combined). The Cd/Zn (6.5/15.2 mmol of dimethylcadmium and diethylzinc) and S (43.4 mmol of hexamethyldisilathiane) samples are each dissolved in 27 mL of trioctylphosphine inside a nitrogen atmosphere glove box. Once the precursor solutions are prepared, the reactor is heated to 150° C. under nitrogen. The precursor solutions are added dropwise over the course of 2 hours at 150° C. using a syringe pump. After the shell growth, the nanocrystals are transferred to a nitrogen atmosphere glovebox and precipitated out of the growth solution by adding a 3:1 mixture of methanol and isopropanol. The isolated core-shell nanocrystals are then dissolved in toluene and used to make quantum dot composite materials.

Example 2

Formulation and Film

Preparation of Optical Component Including Semiconductor Nanocrystals

Formulation:
The following formulation is prepared using optical material including semiconductor nanocrystals (prepared substantially in accordance with the synthesis described in Example 1A).

The semiconductor nanocrystals comprise red-emitting semiconductor nanocrystals dispersed in Toluene and have a spectral component at 609 nm, a FWHM of about 31 nm, a solution quantum yield of 83% and a concentration of 16.4 mg/ml.

3.1 ml of the 16.4 mg/ml suspension of the red-emitting nanocrystals is added to a 20 ml septum capped vial including a magnetic stirrer bar, after the vial is previously closed and purged under vacuum through a syringe needle and then backfilled with nitrogen. Approximately 90 percent of the solvent is removed from the vial by vacuum stripping. 0.504 g of RD-12, a low viscosity reactive diluent commercially available from Radcure Corp., 9 Audrey Pl, Fairfield, N.J. 07004-3401 (also known as Actega Radcure, 5 Mansard Court, Wayne, N.J. 07470) is added through a syringe. Remaining solvent is removed from the vial by vacuum stripping. 2.117 g of DR-150 is then added to the vial through a syringe and the mixture is mixed using a Vortex mixer. (DR- 150 is a UV-curable acrylic formulation commercially available from Radcure). 0.03 gram $TiO_2$ (Ti-Pure R902+ available from DuPont) is next added to the open vial and the mixture is mixed with a Vortex mixer followed by mixing with an homogenizer.

The vial is then capped and deaerated under vacuum and backfilled with nitrogen.

The closed vial is then put in an ultrasonic bath for 50 minutes. Care is taken to avoid temperatures over 40° C. while the sample is in the ultrasonic bath.

The sample is stored in the dark until used to make a film.

Film:

A previously cleaned (Acetone wipe followed by a Methanol wipe) 1"×3" glass microscope slide is laid-out and four 80 micron plastic shim stock tabs are positioned at the corner of a 1"×1" section on the lower portion of the slide. A small quantity of formulation described above is dispensed in the middle of the 1"×1" area. A second pre-cleaned 1"×3" microscope slide is mated to the first microscope slide and clamped together using with mini-office binders. The clamps are centered over the shim stock.

The microscope slide structure is cured in a 5000-EC UV Light Curing Flood Lamp from DYMAX Corporation with an H-bulb (225 $mW/cm^2$) for 10 seconds. It is turned over to the opposite side and is cured for an additional 10 seconds. The thickness of the nanocrystal containing layer is approximately 80 um.

Measurements:

Four LED (CL-191G. available from Citizen Electronics Co., Ltd.) are attached via silver paint to a circuit board which in turn is mounted to a Thermoelectric cooler (TEC) stage using a layer of silicone heat transfer compound to improve thermal contact. The TEC is set at 25. ° C. and the LED chips are driven with a constant current source set at 20.0 mA. The above described LED set-up is positioned in front of a 6 inch diameter integration sphere with a 0.5 inch open port. The microscope slide structure containing the 80 micron cured film containing the red semiconductor nanocrystals described above was positioned between the LED set-up and the open port to the integrating sphere, flush against the port. The spectral data is collected with a fiber coupled Avantes spectrophotometer. Results from the spectral analysis are shown in Table 1 and FIG. 1.

TABLE 1

| Sample | CCT | Ra | x | y |
|---|---|---|---|---|
| LED | 6768 | 56.1 | 0.2937 | 0.4094 |
| LED + QD-Containing Film | 2724 | 92 | 0.4615 | 0.4168 |

FIG. 1 shows a portion of the 1931 CIE Chromaticity diagram. Also plotted are the Planckian Locus 1931 (also referred to herein as blackbody radiation curve or blackbody locus), Correlated Color Temperature points marked on the blackbody radiation curve and corresponding surrounding ANSI nominal CCT tolerance quadrangles (or bins). On the Figure is shown an off-white LED, with the x,y co-ordinates 0.2937, 0.4094 as measured in an integrating sphere. When the film described in this Example is placed over the LED, the result is a warm white light with CIE x,y co-ordinates of 0.4615, 0.4168, and a color temperature is 2700K. The resulting light is "white". In certain embodiments, e.g., the Duv or distance from the blackbody curve is less than 0.007. The white light generated from Example 2 is inside an ANSI bin, and substantially on the blackbody locus.)

Figure 4:
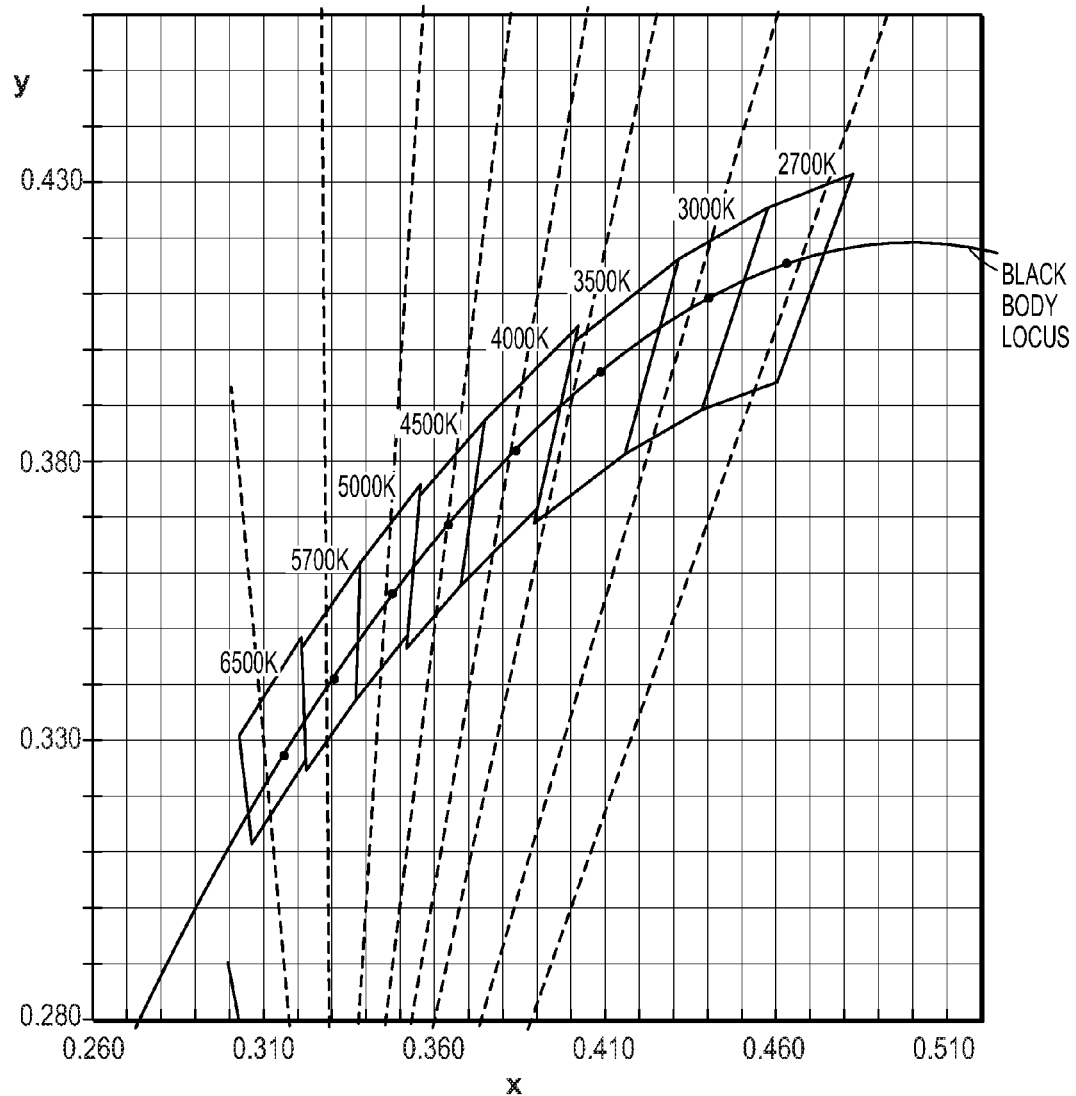
FIG. 4 represents the CIE 1931 x,y Chromaticity Diagram and Eight Nominal CCT (K) Tolerance Quadrangles (ANSI C78.377 standard).

(ANSI bins refer to eight nominal CCT tolerance quadrangles surrounding the blackbody locus, shown in FIG. 4, covering cool-to-warm white color space, as outlined in the ANSI C78.377-2008 standard, which is hereby incorporated herein by reference in its entirety).

Example 3

Stacked Films Including Semiconductor Nanocrystals

Preparation of Optical Component Including Semiconductor Nanocrystals

Formulation:

The following formulation is prepared using optical material including green-emitting semiconductor nanocrystals (prepared substantially in accordance with the synthesis described in Example 1B).

The green-emitting semiconductor nanocrystals are dispersed in Toluene and have a spectral component at 538 nm, a FWHM of about 42 nm, a solution quantum yield of 67% and a concentration of 37 mg/ml.

4.4 ml of the 37 mg/ml suspension of the green-emitting nanocrystals is added to a 20 ml septum capped vial including a magnetic stirrer bar, which was previously closed and purged under vacuum through a syringe needle and then backfilled with nitrogen. Approximately 90 percent of the solvent is removed from the vial by vacuum stripping. 1.5 ml of RD-12, a low viscosity reactive diluent commercially available from Radcure Corp. is added through a syringe. Remaining solvent is removed from the vial by vacuum stripping. 6 ml of DR-150 is then added to the vial through a syringe and the mixture is mixed using a Vortex mixer. (DR-150 is a UV-curable acrylic formulation commercially available from Radcure).

The sample is stored in the dark until used to make a film.

Film:

A previously cleaned (Acetone wipe followed by a Methanol wipe) 1"×3" glass microscope slide is laid-out and four 80 micron plastic shim stock tabs are positioned at the corner of a 1"×1" section on the lower portion of the slide. A small quantity of formulation described above is dispensed in the middle of the 1"×1" area. A second pre-cleaned 1"×3" microscope slide is mated to the first microscope slide and clamped together using with mini-office binders. The clamps are centered over the shim stock.

The microscope slide structure is cured in a 5000-EC UV Light Curing Flood Lamp from DYMAX Corporation with an H-bulb (225 $mW/cm^2$) for 10 seconds. It is turned over to the opposite side and is cured for an additional 10 seconds. The thickness of the nanocrystal containing layer is approximately 80 um.

Figure 2:
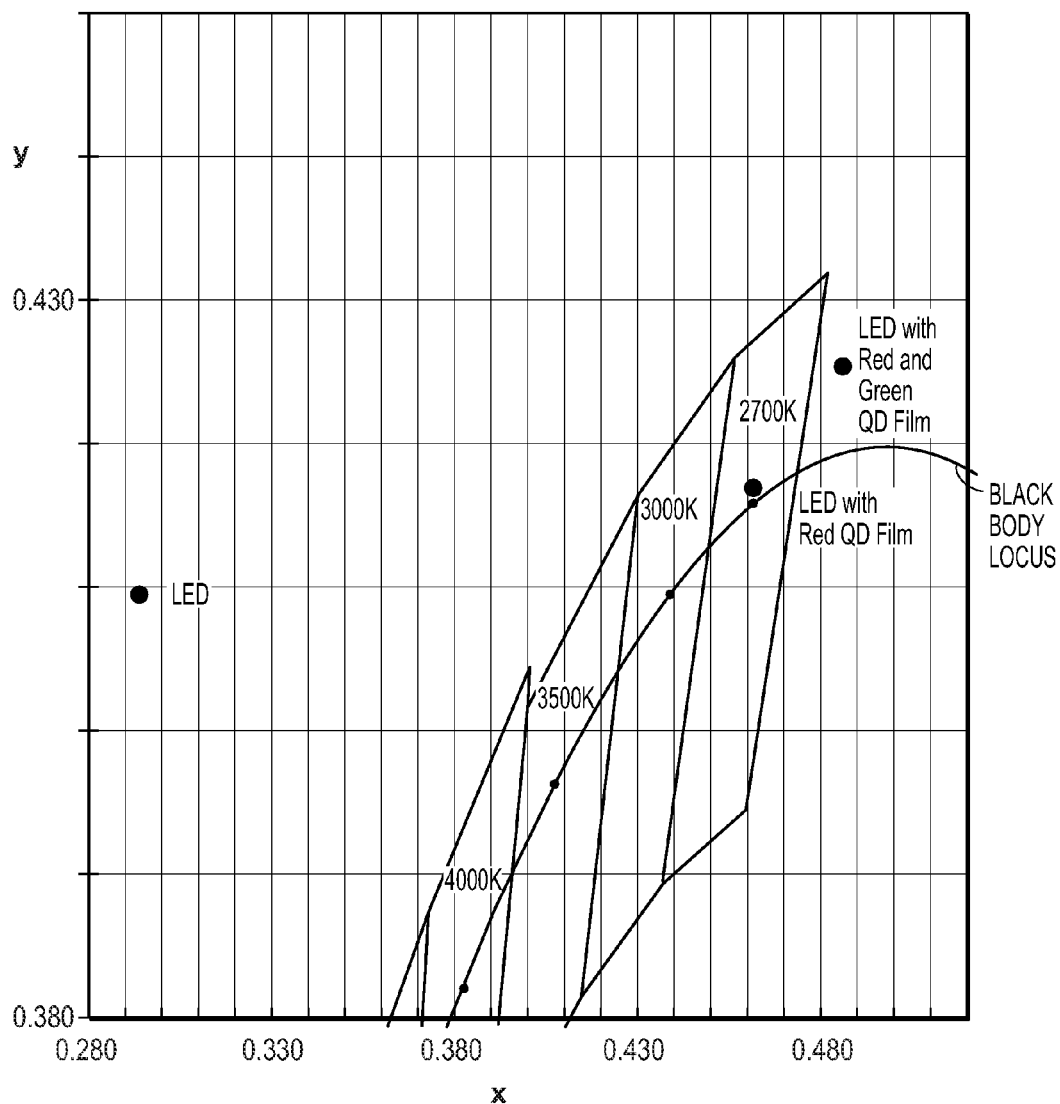

Measurements:

Four LED (CL-191G. available from Citizen Electronics Co., Ltd.) are attached via silver paint to a circuit board which in turn is mounted to a Thermoelectric cooler (TEC) stage using a layer of silicone heat transfer compound to improve thermal contact. The TEC is set at 25.° C. and the LED chips are driven with a constant current source set at 20.0 mA. The above described LED set-up is positioned in front of a 6 inch diameter integration sphere with a 0.5 inch open port. The microscope slide structure containing the 80 micron cured film containing red emitting semiconductor nanocrystals, described in Example 2 and the film containing green emitting semiconductor nanocrystals (described above) prepared as described in this Example 3 are positioned between the LED set-up and the open port to the integrating sphere, flush against the port. The Red-emitting film is closest to the LED. The spectral data is collected with a fiber coupled Avantes spectrophotometer. Results from the spectral analysis are shown in Table 2 and FIG. 2. (Semiconductor nanocrystals may also be referred to herein as quantum dots or QDs.)

The data for this example exhibits a lower CCT for the sample including the red and green QD-containing films with no decrease in lumen output compared to the LED with the Red QD-containing film.

TABLE 2

| Sample | Lumens | CCT | Ra | x | y |
|---|---|---|---|---|---|
| LED | 0.2577 | 6768 | 56.1 | 0.2937 | 0.4094 |
| LED + Red QD-Containing Film | 0.1099 | 2724 | 92 | 0.4615 | 0.4168 |
| LED + Red + Green QD-Containing Film | 0.1098 | 2478 | 92.6 | 0.4858 | 0.4245 |

Because semiconductor nanocrystals have narrow emission linewidths, are photoluminescent efficient, and emission wavelength tunable with the size and/or composition of the nanocrystals, they are preferred quantum confined semiconductor nanoparticles for use in the various aspects and embodiments of the inventions described herein.

The size and composition of quantum confined semiconductor nanoparticles (including, e.g., semiconductor nanocrystals) useful in the various aspects and embodiments of the inventions can be selected such that semiconductor nanocrystals emit photons at a predetermined wavelength of wavelength band in the far-visible, visible, infra-red or other desired portion of the spectrum. For example, the wavelength can be between 300 and 2,500 nm or greater, such as between 300 and 400 nm, between 400 and 700 nm, between 700 and 1100 nm, between 1100 and 2500 nm, or greater than 2500 nm.

Quantum confined semiconductor nanoparticles (including, e.g., semiconductor nanocrystals) are nanometer-scale inorganic semiconductor nanoparticles. Semiconductor nanocrystals include, for example, inorganic crystallites between about 1 nm and about 1000 nm in diameter, preferably between about 2 nm and about 50 nm, more preferably about 1 nm to about 20 nm (such as about 6, 7, 8, 9, 10, 11, 12, 13, 14, 15, 16, 17, 18, 19, or 20 nm).

Semiconductor nanocrystals included in various aspect and embodiments of the inventions most preferably have an average nanocrystal diameter less than about 150 Angstroms (Å). In certain embodiments, semiconductor nanocrystals having an average nanocrystal diameter in a range from about 12 to about 150 Å can be particularly desirable.

However, depending upon the composition and desired emission wavelength of the semiconductor nanocrystal, the average diameter may be outside of these various preferred size ranges.

The semiconductor forming the nanoparticles and nanocrystals for use in the various aspects and embodiments of the inventions described herein can comprise Group IV elements, Group II-VI compounds, Group II-V compounds, Group III-VI compounds, Group III-V compounds, Group IV-VI compounds, Group I-III-VI compounds, Group II-IV-VI compounds, or Group II-IV-V compounds, for example, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary mixtures and/or alloys.

Examples of the shape of the nanoparticles and nanocrystals include sphere, rod, disk, other shape or mixtures thereof.

In certain preferred aspects and embodiments of the inventions, quantum confined semiconductor nanoparticles (including, e.g., semiconductor nanocrystals) include a "core" of one or more first semiconductor materials, which may include an overcoating or "shell" of a second semiconductor material on at least a portion of a surface of the core. In certain embodiments, the shell surrounds the core. A quantum confined semiconductor nanoparticle (including, e.g., semiconductor nanocrystal) core including a shell on at least a portion of a surface of the core is also referred to as a "core/shell" semiconductor nanocrystal.

For example, a quantum confined semiconductor nanoparticle (including, e.g., semiconductor nanocrystal) can include a core comprising a Group IV element or a compound represented by the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as a core include, but are not limited to, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary mixtures and/or alloys.

A shell (or overcoat) can be a semiconductor material having a composition different from the composition of the core. The overcoat of a semiconductor material on a surface of the nanocrystal can include a Group II-VI compounds, Group II-V compounds, Group III-VI compounds, Group III-V compounds, Group IV-VI compounds, Group I-III-VI compounds, Group II-IV-VI compounds, and Group II-IV-V compounds. Examples of materials suitable for use as a shell include, but are not limited to, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlN, AlAs, AlP, AlSb, AlS, PbS, PbO, PbSe, PbTe, TlN, TlP, TlAs, TlSb, Ge, Si, alloys thereof, and/or mixtures thereof, including ternary and quaternary mixtures and/or alloys. For example, ZnS, ZnSe or CdS overcoatings can be grown on CdSe or CdTe nanocrystals. An overcoating process is described, for example, in U.S. Pat. No. 6,322,901. By adjusting the temperature of the reaction mixture during overcoating and monitoring the absorption spectrum of the core, over coated materials having high emission quantum efficiencies and narrow size distributions can be obtained. The overcoating can be between 1 and 10 monolayers thick.

In certain embodiments, the surrounding "shell" material can have a bandgap greater than the bandgap of the core material and can be chosen so as to have an atomic spacing close to that of the "core" substrate. In another embodiment, the surrounding shell material can have a bandgap less than the bandgap of the core material. In a further embodiment, the shell and core materials can have the same crystal structure. Shell materials are discussed further above. For further examples of core/shell semiconductor structures, see U.S. application Ser. No. 10/638,546, entitled "Semiconductor Nanocrystal Heterostructures", filed 12 Aug. 2003, which is hereby incorporated herein by reference in its entirety.

Quantum confined semiconductor nanoparticles are preferably members of a population of semiconductor nanoparticles having a narrow size distribution. More preferably, the quantum confined semiconductor nanoparticles (including, e.g., semiconductor nanocrystals) comprise a monodisperse or substantially monodisperse population of nanoparticles.

Quantum confined semiconductor nanoparticles show strong quantum confinement effects that can be harnessed in designing bottom-up chemical approaches to create optical properties that are tunable with the size and composition of the nanoparticles.

For example, preparation and manipulation of semiconductor nanocrystals are described in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 entitled "Highly Luminescent Color-selective Materials" which are hereby incorporated herein by reference in their entireties. Other examples of the preparation and manipulation of semiconductor nanocrystals are described in U.S. Pat. Nos. 6,322,901 and 6,576,291, and U.S. Patent Application No. 60/550,314, each of which is hereby incorporated herein by reference in its entirety.

In various aspects and embodiments of the invention, quantum confined semiconductor nanoparticles (including, but not limited to, semiconductor nanocrystals) optionally have ligands attached thereto.

In certain embodiments, the ligands are derived from the coordinating solvent used during the growth process. The ligands on a surface can be modified by repeated exposure to an excess of a competing coordinating group to form an overlayer. For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a suspension or dispersion medium. Such affinity improves the stability of the suspension and discourages flocculation of the semiconductor nanocrystal. In other embodiments, semiconductor nanocrystals can alternatively be prepared with use of non-coordinating solvent(s).

Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used.

For example, a coordinating ligand can have the formula:

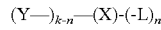

wherein k is 2, 3 or 5, and n is 1, 2, 3, 4 or 5 such that k-n is not less than zero; X is O, S, S=O, SO2, Se, Se=O, N, N=O, P, P=O, As, or As=O; each of Y and L, independently, is aryl, heteroaryl, or a straight or branched C2-12 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—. Each of Ra and Rb, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

A suitable coordinating ligand can be purchased commercially or prepared by ordinary synthetic organic techniques, for example, as described in J. March, Advanced Organic Chemistry, which is incorporated herein by reference in its entirety.

See also U.S. patent application Ser. No. 10/641,292 entitled "Stabilized Semiconductor Nanocrystals", filed 15 Aug. 2003, which is hereby incorporated herein by reference in its entirety.

When an electron and hole localize on a quantum confined semiconductor nanoparticle (including, but not limited to, a semiconductor nanocrystal), emission can occur at an emission wavelength. The emission has a frequency that corresponds to the band gap of the quantum confined semiconductor material. The band gap is a function of the size of the nanoparticle. Quantum confined semiconductor nanoparticles having small diameters can have properties intermediate between molecular and bulk forms of matter. For example, quantum confined semiconductor nanoparticles having small diameters can exhibit quantum confinement of both the electron and hole in all three dimensions, which leads to an increase in the effective band gap of the material with decreasing crystallite size. Consequently, for example, both the optical absorption and emission of semiconductor nanocrystals shift to the blue, or to higher energies, as the size of the crystallites decreases.

The emission from a quantum confined semiconductor nanoparticle can be a narrow Gaussian emission band that can be tuned through the complete wavelength range of the ultraviolet, visible, or infra-red regions of the spectrum by varying the size of the quantum confined semiconductor nanoparticle, the composition of the quantum confined semiconductor nanoparticle, or both. For example, CdSe can be tuned in the visible region and InAs can be tuned in the infra-red region. The narrow size distribution of a population of quantum confined semiconductor nanoparticles can result in emission of light in a narrow spectral range. The population can be monodisperse preferably exhibits less than a 15% rms (root-mean-square) deviation in diameter of the quantum confined semiconductor nanoparticles, more preferably less than 10%, most preferably less than 5%. Spectral emissions in a narrow range of no greater than about 75 nm, preferably 60 nm, more preferably 40 nm, and most preferably 30 nm full width at half max (FWHM) for quantum confined semiconductor nanoparticles that emit in the visible can be observed. IR-emitting quantum confined semiconductor nanoparticles can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of quantum confined semiconductor nanoparticle diameters decreases.

For example, semiconductor nanocrystals can have high emission quantum efficiencies such as greater than 10%, 20%, 30%, 40%, 50%, 60%, 70%, 80%, or 90%.

The narrow FWHM of semiconductor nanocrystals can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A pattern including more than one size of semiconductor nanocrystal can emit light in more than one narrow range of wavelengths. The color of emitted light perceived by a viewer can be controlled by selecting appropriate combinations of semiconductor nanocrystal sizes and materials. The degeneracy of the band edge energy levels of semiconductor nanocrystals facilitates capture and radiative recombination of all possible excitons.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

Quantum confined semiconductor nanoparticles are preferably handled in a controlled (oxygen-free and moisture-free) environment, preventing the quenching of luminescent efficiency during the fabrication process.

An optical material comprising quantum confined semiconductor nanoparticles can be dispersed in a liquid medium and are therefore compatible with thin-film deposition techniques such as spin-casting, drop-casting, and dip coating.

In certain preferred embodiments, an optical material for use in various aspects and embodiments in accordance with the invention can be prepared, for example, from an ink comprising quantum confined semiconductor nanoparticles and a liquid vehicle, wherein the liquid vehicle comprises one or more functional groups that are capable of being polymerized (e.g., cross-linked) to form a host material. In certain embodiments, the functional units can be cross-linked by UV treatment. In certain embodiments, the functional units can be cross-linked by thermal treatment. In certain embodiments, the functional units can be cross-linked by other cross-linking technique readily ascertainable by a person of ordinary skill in a relevant art. In certain embodiments, the optical material including one or more functional groups that are capable of being cross-linked can be the liquid vehicle itself. Optionally, the ink further includes scatterers and/or other additives.

An ink can be deposited onto a surface of a substrate by printing, screen-printing, spin-coating, gravure techniques, inkjet printing, roll printing, etc. The ink can be deposited in a predetermined arrangement. For example, the ink can be deposited in a patterned or unpatterned arrangement.

Due to the positioning of the optical material comprising quantum confined semiconductor nanoparticles in features or layers resulting from these deposition techniques, not all of the surfaces of the nanoparticles may be available to absorb and emit light.

In certain embodiments, an optical material comprising quantum confined semiconductor nanoparticles can be deposited on a surface using contact printing. See, for example, A. Kumar and G. Whitesides, *Applied Physics Letters*, 63, 2002-2004, (1993); and V. Santhanam and R. P. Andres, *Nano Letters*, 4, 41-44, (2004), each of which is incorporated by reference in its entirety. See also U.S. patent application Ser. No. 11/253,612, filed 21 Oct. 2005, entitled "Method And System For Transferring A Patterned Material", of Coe-Sullivan et al. and U.S. patent application Ser. No. 11/253,595, filed 21 Oct. 2005, entitled "Light Emitting Device Including Semiconductor Nanocrystals," of Coe-Sullivan, each of which is incorporated herein by reference in its entirety.

This technique can be use for depositing various thicknesses of optical materials comprising quantum confined semiconductor nanoparticles. In certain embodiments the thickness is selected to achieve the desired % absorption thereby. Most preferably, the quantum confined semiconductor nanoparticles do not absorb any, or absorb only negligible amounts of, the re-emitted photons.

In certain embodiments, methods for applying a material (e.g., an optical material) to a predefined region on a substrate (e.g., support element) may be desirable. The predefined region is a region on the substrate where the material is selectively applied. In certain embodiments wherein the optical component includes one or more different types of quantum confined semiconductor nanoparticles to compensate for more than one spectral deficiency of a light source, different types of quantum confined semiconductor nanoparticle can optionally be included in one or more different optical materials. In certain embodiments wherein the optical component includes one or more different types of quantum confined semiconductor nanoparticles to compensate for more than one spectral deficiency of a light source, different types of quantum confined semiconductor nanoparticle can optionally be included in two or more different optical materials, and each of the different optical materials can be applied to different regions of the substrate and/or as separate layers over the substrate. The material and substrate can be chosen such that the material remains substantially entirely within the predetermined area. By selecting a predefined region that forms a pattern, material can be applied to the substrate such that the material forms a pattern. The pattern can be a regular pattern (such as an array, or a series of lines), or an irregular pattern. Once a pattern of material is formed on the substrate, the substrate can have a region including the material (the predefined region) and a region substantially free of material. In some circumstances, the material forms a monolayer on the substrate. The predefined region can be a discontinuous region. In other words, when the material is applied to the predefined region of the substrate, locations including the material can be separated by other locations that are substantially free of the material.

An optical material comprising quantum confined semiconductor nanoparticles can alternatively be deposited by solution based processing techniques, phase-separation, spin casting, ink-jet printing, silk-screening, and other liquid film techniques available for forming patterns on a surface.

Alternatively, quantum confined semiconductor nanoparticles can be dispersed in a light-transmissive host material (e.g., a polymer, a resin, a silica glass, or a silica gel, etc., which is preferably at least partially light-transmissive, and more preferably transparent, to the light emitted by the quantum confined semiconductor nanoparticles and in which quantum confined semiconductor nanoparticles can be dispersed) that is deposited as a full or partial layer or in a patterned arrangement by any of the above-listed or other known techniques. Suitable materials include many inexpensive and commonly available materials, such as polystyrene, epoxy, polyimides, and silica glass. After application to the surface, such material may contain a dispersion of quantum confined semiconductor nanoparticles where the nanoparticles have been size selected so as to produce light of a given color. Other configurations of quantum confined semiconductor nanoparticles disposed in a material, such as, for example, a two-dimensional layer on a substrate with a polymer overcoating are also contemplated.

Other information that may be useful with the present invention is described in U.S. Application No. 61/050,929, filed 6 May 2008, U.S. Application No. 61/162,293, filed 21 Mar. 2009, U.S. Application No. 61/173,375 filed 28 Apr. 2009, U.S. Application No. 61/175,430 filed 4 May 2009, International Application No. PCT/US2009/02789, filed 6 May 2009, International Application No. PCT/US2009/002796, filed 6 May 2009; U.S. Application No. 60/971,887 of Breen, et al., for "Functionalized Semiconductor Nanocrystals And Method", filed 12 Sep. 2007, U.S. Application No. 60/866,822 of Clough, et al., for "Nanocrystals Including A Group IIIA Element And A Group VA Element, Method, Composition, Device and Other Products", filed 21 Nov. 2006; each of the foregoing hereby being incorporated herein by reference in its entirety.

As used herein, "top", "bottom", "over", and "under" are relative positional terms, based upon a location from a reference point. More particularly, "top" means farthest away from a reference point, while "bottom" means closest to the reference point. Where, e.g., a layer is described as disposed or deposited "over" a component or substrate, there may be other layers, materials, or other components between the layer and component or substrate or the layer may be in contact with the substrate or component. As used herein, "cover" is also a relative position term, based upon a location from a reference point. For example, where a first material is described as covering a second material, the first material is disposed over, but not necessarily in contact with the second material.

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

The invention claimed is:

1. A white-light emitting lighting device comprising an off-white light emitting light source comprises a blue light emitting semiconductor light emitting diode including a luminescent material for converting blue light output to off-white light, wherein the off-white light includes a spectral output including at least one spectral component in a first spectral region from about 400 nm to about 475 nm, at least one spectral component in a second spectral region from about 500 nm to about 550 nm, and at least one deficiency in at least one other spectral region, and an optical component that is positioned to receive at least a portion of the off-white light generated by light source, the optical component comprising an optical material for converting at least a portion of the off-white light to one or more predetermined wavelengths, at least one of which has a wavelength in at least one deficient spectral region, such that white light is emitted by the lighting device, wherein the optical material comprises quantum confined semiconductor nanoparticles, wherein the optical material is fully encapsulated, and wherein the optical material and the optical component are not in direct contact with the off-white light emitting light source.

2. A white-light emitting lighting device in accordance with claim 1 wherein at least one predetermined wavelength is in a range from about 575 nm to about 650 nm.

3. A white-light emitting lighting device in accordance with claim 1 wherein at least one predetermined wavelength in a-range from about 450 nm to about 500 nm and at least one predetermined wavelength is in the range from about 450 nm to about 500 nm.

4. A white-light emitting lighting device in accordance with claim 1 wherein the white light emitted by the white-light emitting lighting device has a General Color Rendering Index ($R_a$) of at least 95.

5. A white-light emitting lighting device in accordance with claim 1 wherein the lumens per watt efficiency of white light created from the off-white-light source device does not substantially vary as a function of the color temperature of the white light.

6. A white-light emitting lighting device in accordance with claim 1 wherein the optical material further comprises a host material in which the quantum confined semiconductor nanoparticles are distributed.

7. A white-light emitting lighting device in accordance with claim 6 wherein the optical material further comprises light scattering particles.

8. A white-light emitting lighting device in accordance with claim 1 wherein the light source comprises an off-white light emitting solid state semiconductor light emitting diode.

9. A white-light emitting lighting device in accordance with claim 8 wherein the off-white light emitting LED comprises a blue light emitting semiconductor LED including a phosphor material for converting the blue LED light output to off-white light.

10. A white-light emitting lighting device in accordance with claim 1 wherein optical material comprises quantum confined semiconductor nanoparticles capable of emitting red light.

11. A white-light emitting lighting device in accordance with claim 9 wherein optical material comprises quantum confined semiconductor nanoparticles capable of emitting red light.

12. A white-light emitting lighting device comprising one or more light sources comprising a solid state semiconductor light emitting diode (LED) comprising a blue light emitting semiconductor light emitting diode including a luminescent material for converting the blue light output to off-white light, wherein the off-white light includes emission in the blue spectral region and a spectral component in the green region and has at least one deficiency in at least the orange to red spectral region; and an optical component that is positioned to receive light emitted by the LED, the optical component comprising an optical material for converting at least a portion of the off-white light to light in the spectral region with a wavelength in a range from about 575 nm to about 650 nm such that white light is emitted by the lighting device, wherein the optical material comprises quantum confined semiconductor nanoparticles, wherein the optical material is fully encapsulated, and wherein the optical material and the optical component are not in direct contact with the off-white light emitting light source.

13. A white-light emitting lighting device in accordance with claim 12 wherein no more than 95% of the emission in the blue spectral region is converted by the quantum confined semiconductor nanoparticles.

14. A white-light emitting lighting device in accordance with claim 1 wherein the optical component comprises one or more different types of quantum confined semiconductor nanoparticles, wherein each different type of quantum confined semiconductor nanoparticles emits light at predetermined wavelength that is different from the predetermined wavelength emitted by at least one of another type of quantum confined semiconductor nanoparticles included in the optical material, and wherein one or more different predetermined wavelengths are selected such that the optical material will compensate for one or more spectral deficiencies of the light source.

15. A white-light emitting lighting device comprising a light source comprising one or more LEDs that, during operation, emits off-white light that includes emission in the blue spectral region and in the green spectral region and includes a deficiency in the orange to red spectral region; and an optical component that is positioned to receive off-white light emitted by the light source, the optical component comprising an optical material for converting at least a portion of the emission in the blue spectral region to light in the spectral region with a wavelength in a range from about 595 nm to about 620 nm such that white light is emitted by the white-light emitting lighting device, and wherein the optical material comprises quantum confined semiconductor nanoparticles, wherein the optical material is fully encapsulated, and wherein the optical material and the optical component are not in direct contact with the off-white light emitting light source.

16. A white-light emitting lighting device in accordance with claim 1 wherein the optical component includes two or more different types of quantum confined semiconductor nanoparticles that emit at different predetermined wavelengths, wherein the different types of quantum confined semiconductor nanoparticles are included in two or more different optical materials.

17. A white-light emitting lighting device in accordance with claim 16 wherein the different optical materials are included in the optical component as separate layers of a layered arrangement.

18. A white-light emitting lighting device in accordance with claim 16 wherein the different optical materials are included in the optical component as separate features of a patterned layer.

* * * * *